United States Patent
Pham et al.

(10) Patent No.: US 7,592,223 B2
(45) Date of Patent: Sep. 22, 2009

(54) METHODS OF FABRICATING NON-VOLATILE MEMORY WITH INTEGRATED SELECT AND PERIPHERAL CIRCUITRY AND POST-ISOLATION MEMORY CELL FORMATION

(75) Inventors: Tuan Pham, San Jose, CA (US); Takashi Orimoto, Sunnyvale, CA (US); Masaaki Higashitani, Cupertino, CA (US); James Kai, Santa Clara, CA (US); George Matamis, San Jose, CA (US)

(73) Assignee: SanDisk Corporation, Milpitas, CA (US)

( * ) Notice: Subject to any disclaimer, the term of this patent is extended or adjusted under 35 U.S.C. 154(b) by 0 days.

(21) Appl. No.: 12/061,642

(22) Filed: Apr. 2, 2008

(65) Prior Publication Data

US 2008/0268596 A1 Oct. 30, 2008

Related U.S. Application Data

(60) Provisional application No. 60/909,713, filed on Apr. 2, 2007.

(51) Int. Cl.
*H01L 21/8247* (2006.01)
(52) U.S. Cl. .............. 438/258; 438/296; 257/E21.179
(58) Field of Classification Search ......... 438/257–267, 438/954, 296; 257/E21.179
See application file for complete search history.

(56) References Cited

U.S. PATENT DOCUMENTS

| | | | |
|---|---|---|---|
| 5,459,091 A | 10/1995 | Hwang | |
| 5,668,034 A | 9/1997 | Sery et al. | |
| 5,861,347 A | 1/1999 | Maiti et al. | |
| 6,040,220 A | 3/2000 | Gardner et al. | |
| 6,066,534 A | 5/2000 | Son | |
| 6,204,159 B1 | 3/2001 | Chang et al. | |
| 6,746,920 B1 | 6/2004 | Wen et al. | |
| 6,888,755 B2 | 5/2005 | Harari | |
| 7,026,684 B2 | 4/2006 | Sakuma et al. | |
| 2002/0146883 A1 | 10/2002 | Furuhata | |
| 2005/0207225 A1 | 9/2005 | Chen et al. | |
| 2006/0286749 A1* | 12/2006 | Tseng et al. | ................ 438/261 |

(Continued)

OTHER PUBLICATIONS

Chan, et al., "A True Single Transistor Oxide-Nitride-Oxide EEPROM Device," IEEE Electron Device Letters, vol. EDL-8, No. 3, Mar. 1987, pp. 93-95.

(Continued)

*Primary Examiner*—Richard A. Booth
(74) *Attorney, Agent, or Firm*—Vierra Magen Marcus & DeNiro LLP

(57) ABSTRACT

Non-volatile semiconductor memory devices with dual control gate memory cells and methods of forming the same using integrated select and peripheral circuitry formation are provided. Strips of charge storage material elongated in a column direction across the surface of a substrate with strips of tunnel dielectric material therebetween are formed. The strips of charge storage material can include multiple layers of charge storage material to form composite charge storage structures in one embodiment. After forming isolation trenches in the substrate between active areas below the strips of charge storage material, spacer-assisted patterning is used to form a pattern at the memory array region. Strips of photoresist are patterned over a portion of the pattern at the memory array. Photoresist is also applied at the peripheral circuitry region. At least a portion of the layer stack is etched using the photoresist as a mask before removing the photoresist and etching the strips of charge storage material to form the charge storage structures.

12 Claims, 16 Drawing Sheets

U.S. PATENT DOCUMENTS

2007/0128787 A1    6/2007    Higashitani
2007/0243680 A1   10/2007   Harari et al.
2008/0123385 A1*  5/2008    Aritome ..................... 365/63

OTHER PUBLICATIONS

Nozaki, et al., "A 1-MbEEPROM with MONOS Memory Cell for Semiconductor Disk Application," Journal of Solid State Circuits, vol. 26, No. 4, Apr. 1991 IEEE, pp. 497-501.

Choi, Yang-Kyu, et al., "Sublithographic nanofabrication technology for nanocatalysts and DNA chips," J.Vac Sci. Technol. B 21(6), American Vacuum Society, Nov./Dec. 2003, pp. 2951-2955.

U.S. Appl. No. 11/623,314, filed Jan. 15, 2007.
U.S. Appl. No. 11/623,315, filed Jan. 15, 2007.
U.S. Appl. No. 11/765,866, filed Jun. 20, 2007.
U.S. Appl. No. 12/014,689, filed Jan. 15, 2008.
U.S. Appl. No. 12/061,641, filed Apr. 2, 2008.
U.S. Appl. No. 12/058,512, filed Mar. 28, 2008.

Invitation To Pay Additional Fees, Patent Cooperation Treaty, PCT Application No. PCT/US2008/059035 filed on Apr. 1, 2008, Jul. 16, 2008.

* cited by examiner (y-direction)

(x-direction)

(x-direction)

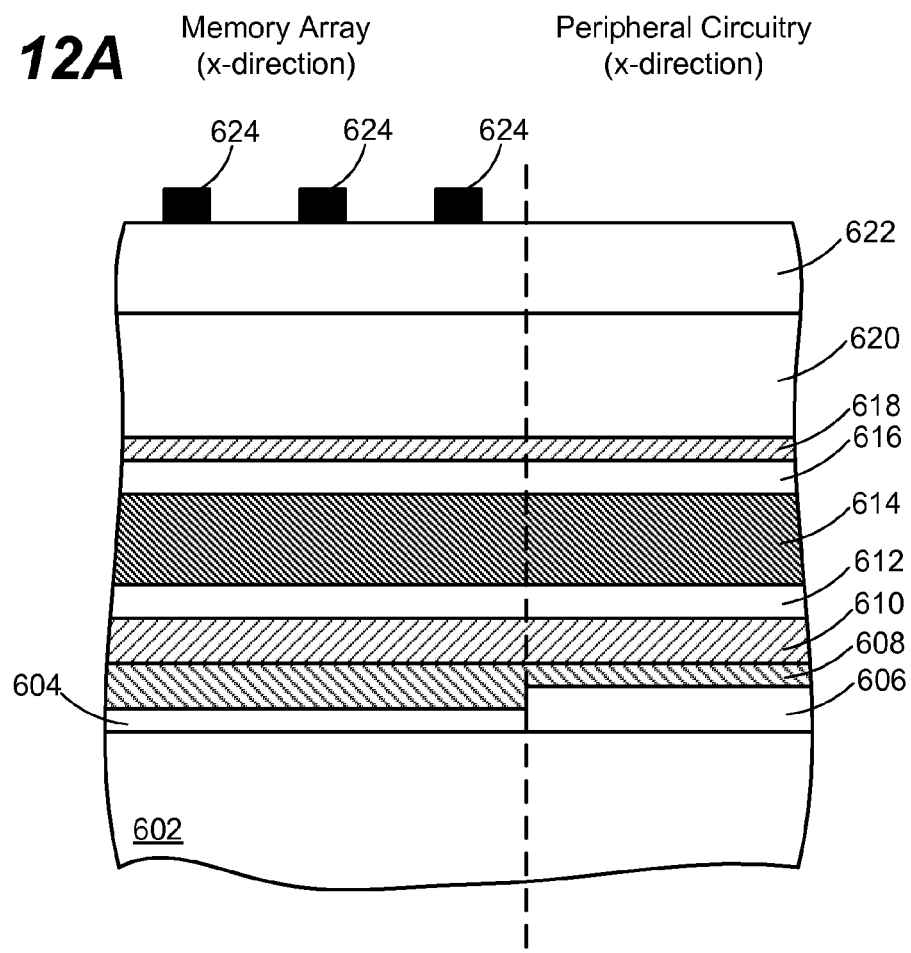
FIG. 12A  Memory Array (x-direction)   Peripheral Circuitry (x-direction)
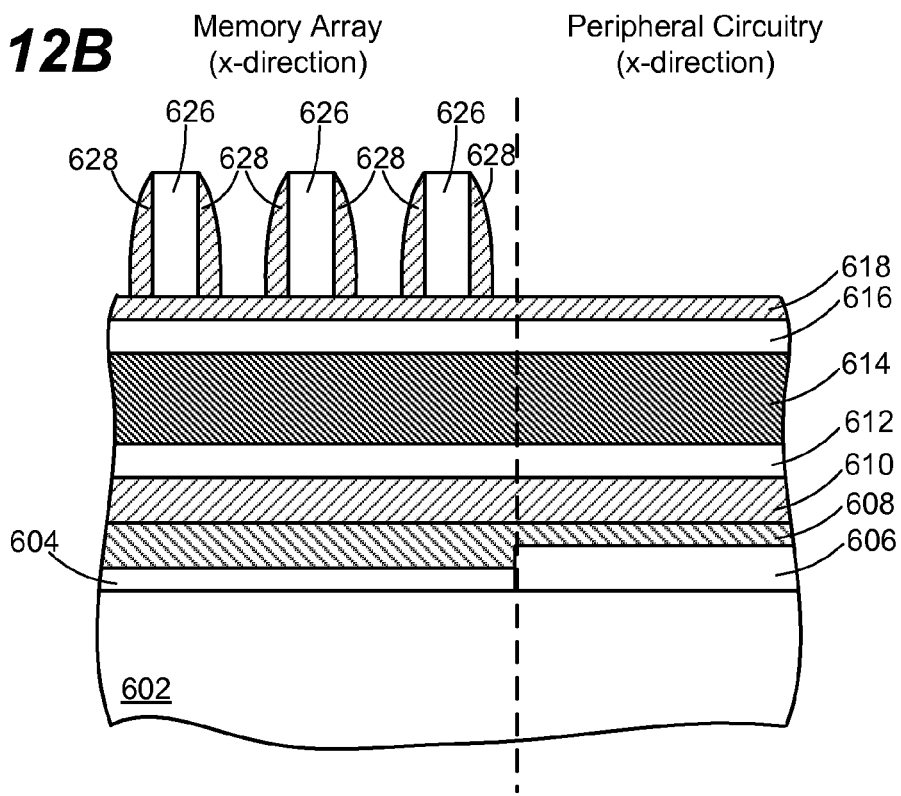
FIG. 12B  Memory Array (x-direction)   Peripheral Circuitry (x-direction)

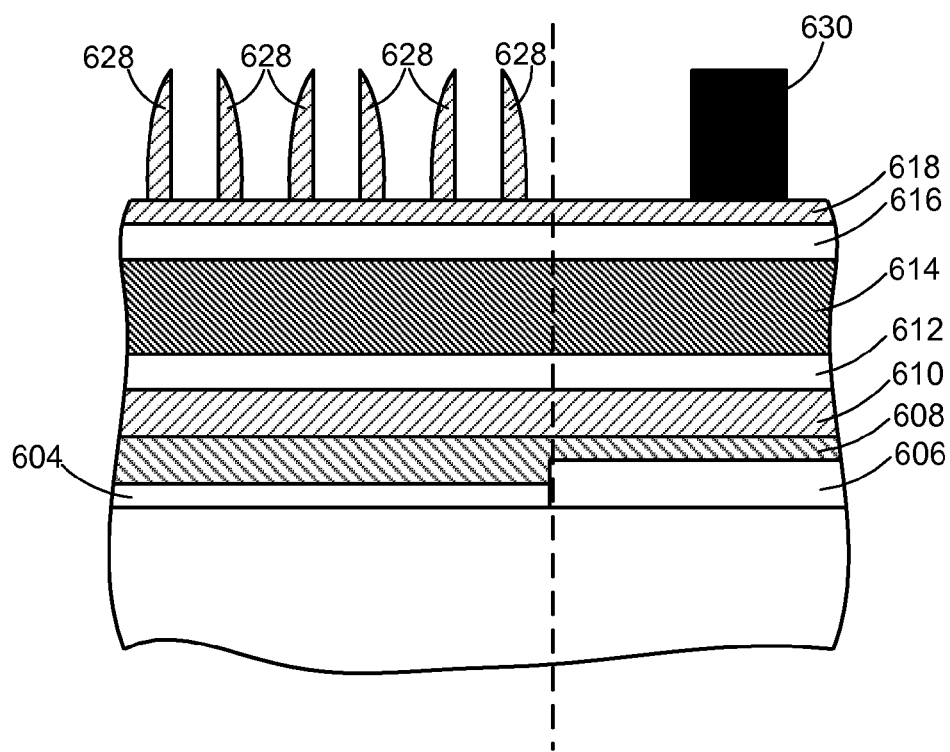
FIG. 12C  Memory Array (x-direction)   Peripheral Circuitry (x-direction)
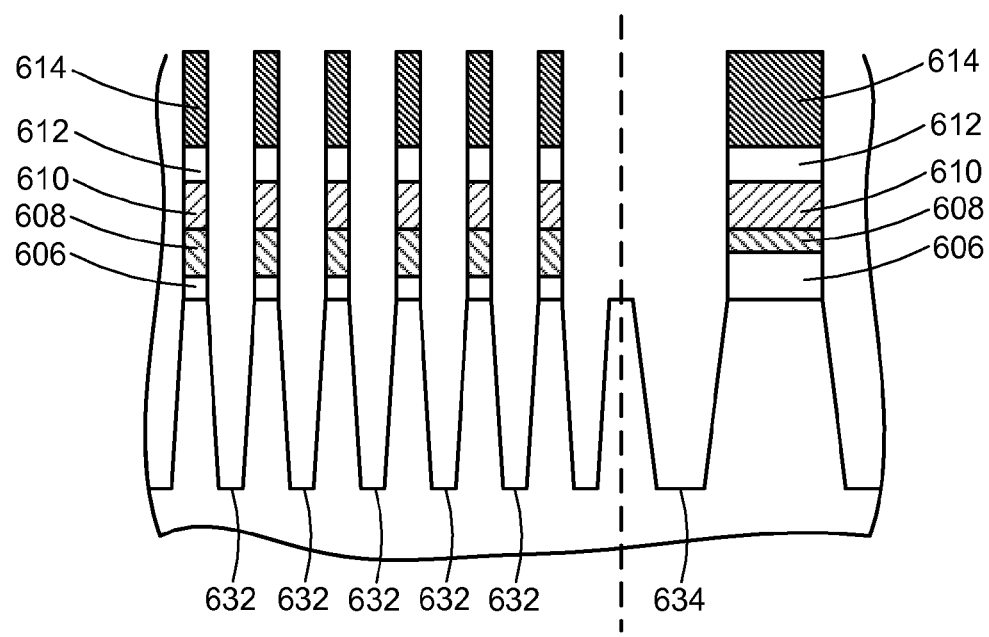
FIG. 12D  Memory Array (x-direction)   Peripheral Circuitry (x-direction)

METHODS OF FABRICATING NON-VOLATILE MEMORY WITH INTEGRATED SELECT AND PERIPHERAL CIRCUITRY AND POST-ISOLATION MEMORY CELL FORMATION

PRIORITY INFORMATION

The present application claims priority from U.S. Provisional Patent Application No. 60/909,713, entitled "NON-VOLATILE MEMORY FABRICATION," by Kai et al., filed Apr. 2, 2007, incorporated by reference herein in its entirety.

BACKGROUND OF THE INVENTION

1. Field of the Invention

Embodiments of the present disclosure are directed to high density semiconductor devices, such as non-volatile memory, and methods of forming the same.

2. Description of the Related Art

In most integrated circuit applications, the substrate area allocated to implement the various integrated circuit functions continues to decrease. Semiconductor memory devices, for example, and their fabrication processes are continuously evolving to meet demands for increases in the amount of data that can be stored in a given area of the silicon substrate. These demands seek to increase the storage capacity of a given size of memory card or other type of package and/or decrease their size.

Electrical Erasable Programmable Read Only Memory (EEPROM), including flash EEPROM, and Electronically Programmable Read Only Memory (EPROM) are among the most popular non-volatile semiconductor memories. One popular flash EEPROM architecture utilizes a NAND array having a large number of strings of memory cells connected through one or more select transistors between individual bit lines and common source lines. FIG. 1 is a top view showing a single NAND string and FIG. 2 is an equivalent circuit thereof. The NAND string depicted in FIGS. 1 and 2 includes four transistors 100, 102, 104 and 106 in series between a first select gate 120 and a second select gate 122. Select gate 120 connects the NAND string to a bit line via bit line contact 126. Select gate 122 connects the NAND string to a common source line via source line contact 128. Each of the transistors 100, 102, 104 and 106 is an individual storage element and includes a control gate and a floating gate. For example, transistor 100 includes control gate 100CG and floating gate 100FG, transistor 102 includes control gate 102CG and floating gate 102FG, transistor 104 includes control gate 104CG and floating gate 104FG, and transistor 106 includes control gate 106CG and floating gate 106FG. Control gate 100CG is connected to word line WL3, control gate 102CG is connected to word line WL2, control gate 104CG is connected to word line WL1, and control gate 106CG is connected to word line WL0.

Note that although FIGS. 1 and 2 show four memory cells in the NAND string, the use of four transistors is only provided as an example. A NAND string can have less than four memory cells or more than four memory cells. For example, some NAND strings will include eight memory cells, 16 memory cells, 32 memory cells, or more.

The charge storage elements of current flash EEPROM arrays are most commonly electrically conductive floating gates, typically formed from a doped polysilicon material. Another type of memory cell useful in flash EEPROM systems utilizes a non-conductive dielectric material in place of a conductive floating gate to form a charge storage element capable of storing charge in a non-volatile manner. Such a cell is described in an article by Chan et al., "A True Single-Transistor Oxide-Nitride-Oxide EEPROM Device," IEEE Electron Device Letters, Vol. EDL-8, No. 3, March 1987, pp. 93-95. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. See also Nozaki et al., "A 1-Mb EEPROM with MONOS Memory Cell for Semiconductor Disk Application," EEE Journal of Solid-State Circuits, Vol. 26, No. 4, April 1991, pp. 497-501, which describes a similar cell in a split-gate configuration where a doped polysilicon gate extends over a portion of the memory cell channel to form a separate select transistor.

Memory cells of typical non-volatile flash arrays are divided into discrete blocks of cells that are erased together. That is, the block contains the minimum number of cells that are separately erasable together as an erase unit, although more than one block may be erased in a single erase operation. Additionally, more recent memories may provide erasing in smaller units than blocks. Each block typically stores one or more pages of data, where a page includes the minimum number of cells that are simultaneously subjected to a data programming and read operation as the basic unit of programming and reading, although more than one page may be programmed or read in a single operation. Each page typically stores one or more sectors of data, the size of the sector being defined by the host system. An example is a sector of 512 bytes of user data, following a standard established with magnetic disk drives, plus some number of bytes of overhead information about the user data and/or the block in which it is stored.

As demands for higher densities in integrated circuit applications have increased, fabrication processes have evolved to reduce the minimum feature sizes of circuit elements such as the gate and channel regions of transistors. As the feature sizes have decreased, modifications to the traditional NAND memory array have been made to, among other things, decrease parasitic capacitances associated with small feature sizes. U.S. Pat. No. 6,888,755, entitled "Flash Memory Cell Arrays Having Dual Control Gates Per Memory Cell Charge Storage Element," by Eliyahou Harari, incorporated herein by reference, describes a memory array with a dual control gate structure. U.S. Pat. No. 7,026,684, entitled "Nonvolatile Semiconductor Memory Device," by Sakuma, et al., incorporated herein by reference, describes a memory with an inverted-T type floating gate structure. The charge storage element is divided into two regions having different dimensions.

Fabricating non-volatile memories with more advanced charge storage and control gate structures presents unique requirements for the employed fabrication technologies. Many conventional techniques prove insufficient when working at the reduced feature sizes these memories utilize. More advanced technologies have evolved to meet some of the demands, such as spacer-assisted patterning. Nevertheless, problems still arise. Moreover, these advanced technologies include their own side effects on the fabrication processes that have to be addressed. For example, advanced patterning technologies used to form reduced feature sizes for the cell regions may not be compatible with existing processes that incorporate the formation of other devices at other regions of the substrate.

SUMMARY OF THE INVENTION

High density semiconductor devices and methods of fabricating the same are provided in accordance with one or embodiments.

Non-volatile semiconductor memory devices with dual control gate memory cells and methods of forming the same using integrated select and peripheral circuitry formation are provided. Strips of charge storage material elongated in a column direction across the surface of a substrate with strips of tunnel dielectric material therebetween are formed. The strips of charge storage material can include multiple layers of charge storage material to form composite charge storage structures in one embodiment. After forming isolation trenches in the substrate between active areas below the strips of charge storage material, spacer-assisted patterning is used to form a pattern at the memory array region. Strips of photoresist are patterned over a portion of the pattern at the memory array. Photoresist is also applied at the peripheral circuitry region. At least a portion of the layer stack is etched using the photoresist as a mask before removing the photoresist and etching the strips of charge storage material to form the charge storage structures. The photoresist covering at the memory array region allows the select gate regions to be fabricated with the memory cells, while achieving a dimension in the column direction that is larger than that of the charge storage structures. Similarly, the peripheral circuitry region can be integrated into the fabrication process while providing a larger dimension for these gate regions.

A method of making a non-volatile memory using a semiconductor substrate in accordance with one embodiment includes forming a first layer of dielectric material over a surface of the substrate, forming a set of strips of charge storage material elongated in a first direction over the surface of the substrate with the first layer of dielectric material therebetween, forming a set of strips of one or more additional layers over the first set of strips of charge storage material, forming isolation trenches in the substrate elongated in the first direction between active areas of the substrate below the set of strips of charge storage material, forming a pattern over the set of strips of charge storage material for etching a set of charge storage structures from each set, covering a portion of the pattern with a cover, etching at least one of said one or more additional layers while covering the portion of the pattern, removing the cover from the portion of the pattern, etching the set of strips of charge storage material using the pattern to form charge storage structures having sidewalls elongated in the first direction with spaces between sidewalls of regions adjacent in the second direction, forming a second layer of dielectric material along the sidewalls of the set of charge storage structures, and forming a set of strips of conductive material elongated in the second direction and at least partially occupying the spaces between adjacent charge storage regions.

Embodiments can further include etching the set of strips of charge storage material after removing the cover to form a gate region for a select gate of each set. The gate region will include a dimension in the first direction substantially equal to a dimension of the cover in the first direction. The method can also include integrating the formation of peripheral circuitry by applying a strip of resist material over the one or more additional layers at a portion of the peripheral circuitry region of the substrate. Etching the at least one of the one or more additional layers can then be performed while the strip of resist material is over the portion of the peripheral circuitry region of the substrate.

Other features, aspects, and objects of the disclosed technology can be obtained from a review of the specification, the figures, and the claims.

DETAILED DESCRIPTION

Figure 1:
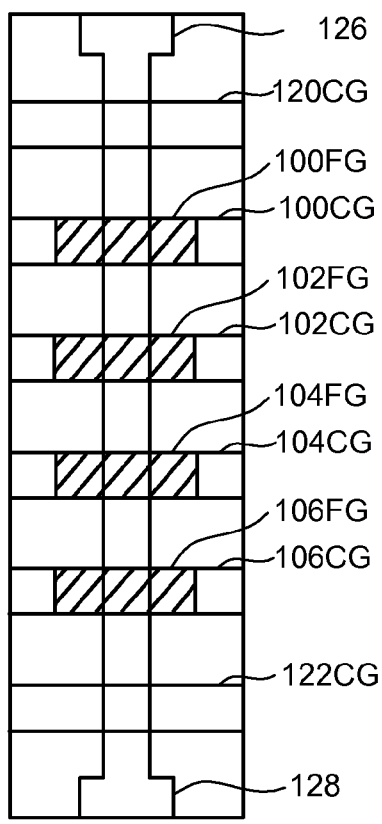
FIG. 1 is a top view of a NAND string.
Figure 2:
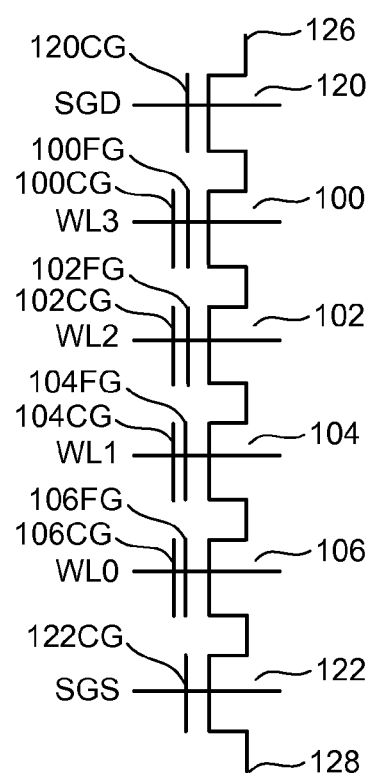
FIG. 2 is an equivalent circuit diagram of the NAND string depicted in FIG. 1.
Figure 3:
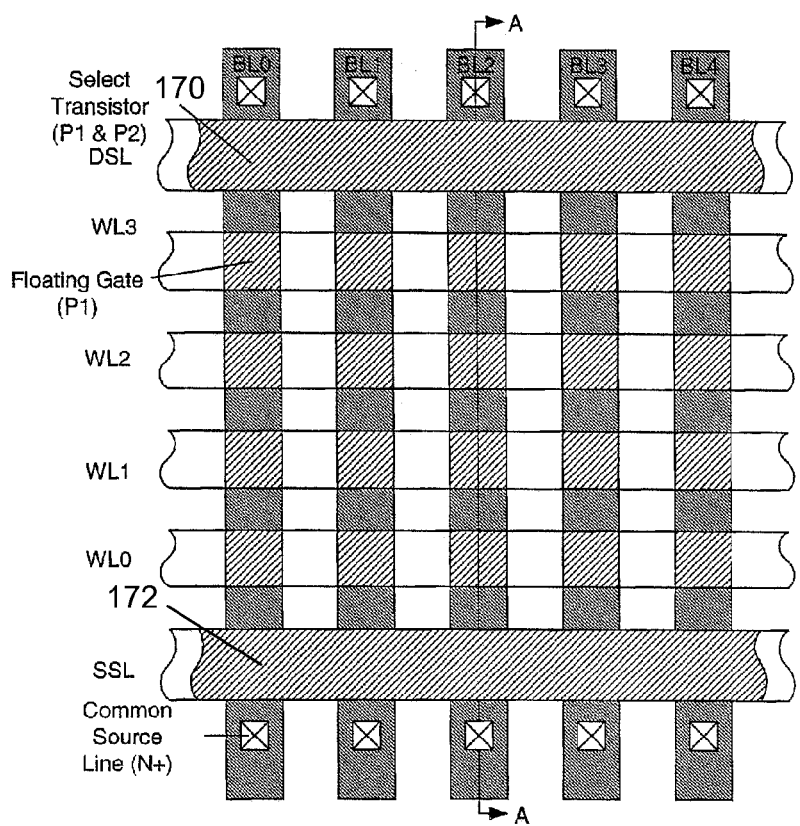
FIG. 3 is a plan view of a portion of a NAND flash memory array.
Figure 4:
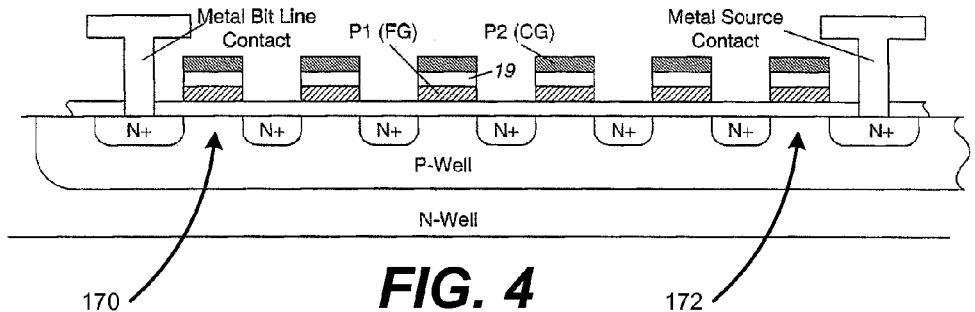
FIG. 4 is an orthogonal cross-sectional view taken along line A-A of the portion of the flash memory array depicted in FIG. 4.

A portion of a traditional NAND memory array is shown in plan view in FIG. 3. BL0-BL4 represent bit line connections to global vertical metal bit lines (not shown). Four floating gate memory cells are shown in each string by way of example. Typically, the individual strings include 16, 32 or more memory cells, forming a column of memory cells. Control gate (word) lines labeled WL0-WL3 extend across multiple strings over rows of floating gates, often in polysilicon. FIG. 4 is a cross-sectional view taken along line A-A of FIG. 3, depicting polysilicon layer P2 from which the control gate lines are formed. The control gate lines are typically formed over the floating gates as a self-aligned stack, and are capacitively coupled to the floating gates through an intermediate dielectric layer 162. The top and bottom of the string connect to a bit line and a common source line through select transistors (gates) 170 and 172, respectively. Gate 170 is controlled by selection line DSL and gate 172 is controlled by selection line SSL. The floating gate material (P1) can be shorted to the control gate for the select transistors to be used as the active gate. Capacitive coupling between the floating gate and the control gate allows the voltage of the floating gate to be raised by increasing the voltage on the control gate. An individual cell within a column is read and verified during programming by causing the remaining cells in the string to be turned on hard by placing a relatively high voltage on their respective word lines and by placing a relatively lower voltage on the one selected word line so that the current flowing through each string is primarily dependent only upon the level of charge stored in the addressed cell below the selected word line. That current typically is sensed for a large number of strings in parallel, in order to read charge level states along a row of floating gates in parallel. Examples of NAND memory cell array architectures and their operation as part of a memory system are found in U.S. Pat. Nos. 5,570,315, 5,774,397 and 6,046,935.

Figure 5:
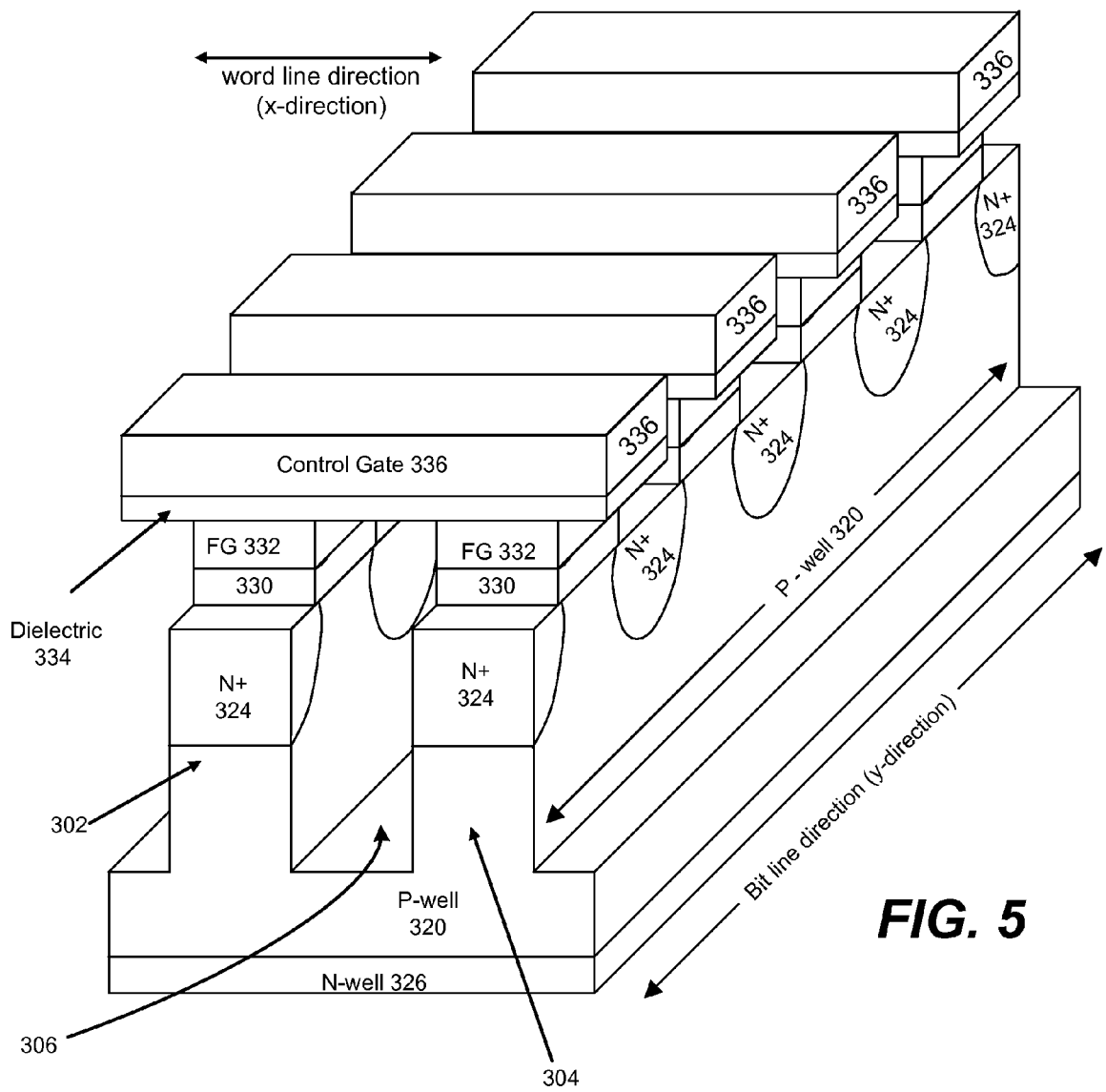
FIG. 5 is a three-dimensional drawing of a pair of four word line long portions of two NAND strings.

FIG. 5 is a three-dimensional block diagram of two exemplary NAND strings 302 and 304 that may be fabricated as part of a larger flash memory array. FIG. 5 depicts four memory cells on strings 302 and 304 as an example. FIG. 5 depicts N-well 326 below P-well 320. The bit line or y-direction runs along the NAND strings, and the word line or x-direction runs perpendicular to the NAND string or the bit line direction. The word line direction may also be referred to as the row direction and the bit line direction referred to as the column direction. The P-type substrate below N-well 336 is not shown in FIG. 5. In one embodiment, the control gates form the word lines. A continuous layer of conductive layer 336 can be formed which is consistent across a row in order to provide a common word line or control gate for each device on that word line. In such a case, this layer can be considered to form a control gate for each memory cell at the point where the layer overlaps a corresponding floating gate layer 332. In other embodiments, individual control gates can be formed and then interconnected by a separately formed word line.

When fabricating a NAND-type non-volatile memory system, including NAND strings as depicted in FIG. 5, electrical isolation is provided in the word line direction between adjacent strings. In the embodiment depicted in FIG. 5, NAND string 302 is separated from NAND string 304 by an open area or void 306. Typically, an insulating material or dielectric is formed between adjacent NAND strings in this open area.

Figure 6:
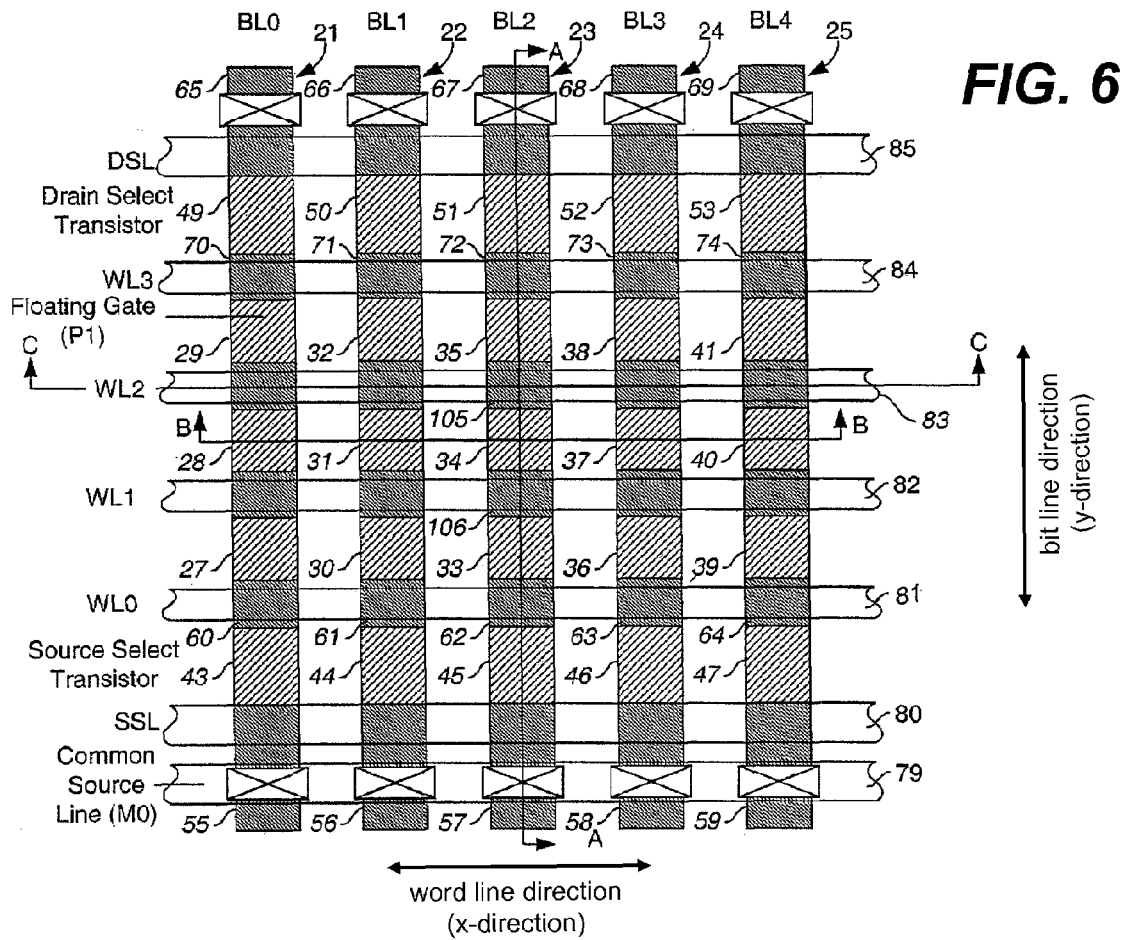
FIG. 6 is a plan view of a portion of a NAND flash memory array having a dual control-gate structure.

A NAND memory array having two control gates per memory cell is illustrated in plan view in FIG. 6. Five NAND strings 21-25 of series connected memory cells are included, with three floating gates or charge storage elements shown in each string. String 21 includes floating gates 27, 28, 29, string 22 includes floating gates 30, 31, 32, string 23 includes floating gates 33, 34, 35, string 24 includes floating gates 36, 37, 38, and string 25 includes floating gates 39, 40, and 41. Only a small rectangular array of fifteen memory cells is illustrated for ease of explanation. Actual implementations of such an array would typically include millions of such memory cells forming thousands of NAND strings, each string normally having 16, 32 or more memory cells.

Each NAND string includes two select transistors, one at each end of the string, to controllably connect the string between a different one of global bit lines BL0-BL4 and a common source line. A voltage is applied to respective source select gates 43-47 to control connection of one end of their respective memory cell strings 21-25 to the common source line. The other ends of the strings 21-25 are connected through respective drain select transistors 49-53 to the respective bit lines BL0-BL4. Column control circuitry applies a voltage to each bit line that is representative of the specific data to be written, or to sense the voltage or current of a corresponding string or memory cell during a read or verify operation. The select transistors include respective source and drain regions 55-64 and 65-74 in a semiconductor substrate.

Control gate (word) lines 81-84 are positioned between the floating gates instead of on top of them as in traditional NAND memory arrays. Each control gate line extends across multiple strings of memory cells and is capacitively coupled through a suitable insulating dielectric, such as multi-layer oxide-nitride-oxide (ONO), to the floating gates on both sides. Additional coupling area is obtained by using the sidewall areas of both sides of the floating gates. The floating gates can be made thicker (higher) than usual in order to increase this coupling area, and the control gates in between them are then made to be at least as thick as the floating gates in order to take advantage of the added coupling area. An advantage is that this coupling area may be controlled largely independent of the coupling area of the floating gates and the substrate, resulting in a desirably high coupling ratio even as the coupling area of the floating gates with the substrate is reduced during decreases in device dimensions. The principles, devices and techniques disclosed hereinafter can be used with traditional NAND architectures having word lines positioned above floating gates, or architectures having word lines between the floating gates as shown in FIG. 6.

Two control gate or word lines replace a single word line of conventional NAND arrays in FIG. 6. For example, the word line that would extend across the row of floating gates 27, 30, 33, 36 and 39 in a conventional array is replaced by two control gate lines 81 and 82 (WL0 and WL1). Similarly, a word line that would normally extend across the row of floating gates 28, 31, 34, 37 and 40 is replaced by two control gate lines 82 and 83 (WL1 and WL2). The control lines 81-84 are elongated in the x-direction across the array and separated in the y-direction by the length of the intervening floating gates and the thicknesses of the dielectric layers between them. Although the size of the memory floating gate is typically made as small as the photolithography allows in both x and y dimensions, the channel length of the select transistors 43-47 and 49-53 (y-dimension) is typically slightly larger than the minimum feature size to ensure it can effectively block all conduction including leakage when the maximum voltage is applied across it.

Figure 7:
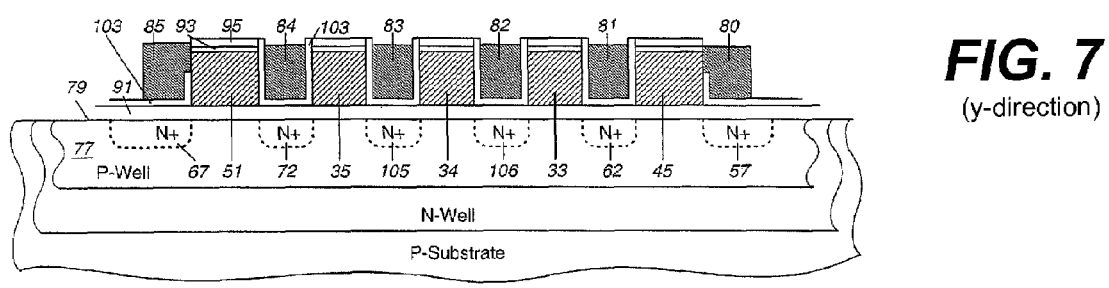
FIG. 7 is an orthogonal cross-sectional view taken along line A-A of the portion of the flash memory array depicted in FIG. 6.
Figure 8:
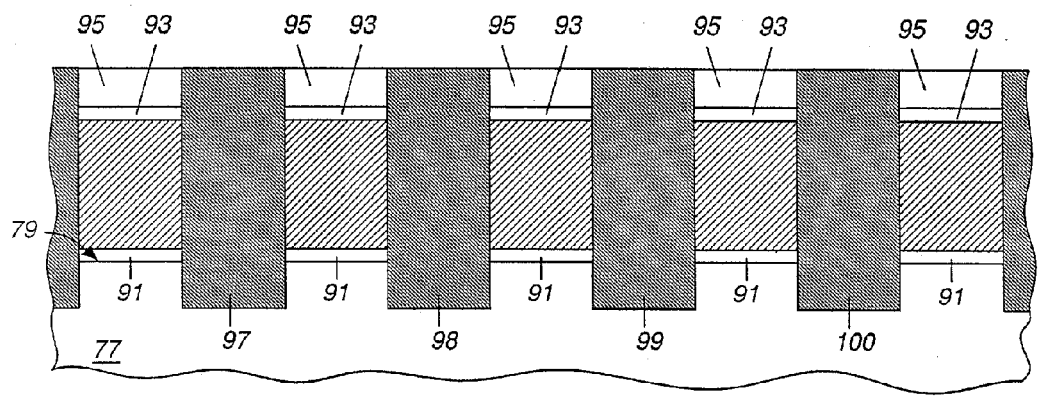
FIG. 8 is an orthogonal cross-sectional view taken along line B-B of the portion of the flash memory array depicted in FIG. 6.
Figure 9:
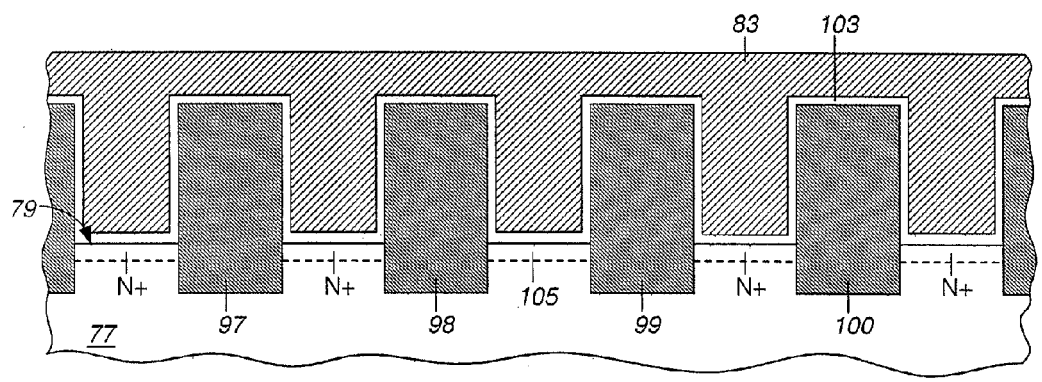
FIG. 9 is an orthogonal cross-sectional view taken along line C-C of the portion of the flash memory array depicted in FIG. 6.

FIG. 7 is an orthogonal cross-sectional view of the array shown in FIG. 6 taken along line A-A in the y-direction through one string of memory cells. FIG. 8 is an orthogonal cross-sectional view of the array taken along line B-B in the x-direction along a row of memory cells extending across multiple strings. FIG. 9 is a cross-sectional view of the array taken along line C-C in the x-direction along a word line. A layer 91 of tunnel dielectric (e.g., silicon oxide, $SiO_2$) is formed on the surface 79 of the substrate 77 to a thickness of about 8 nm. A first layer of the charge storage material (e.g., doped polysilicon) is formed over at least the area of the array from which the floating gates 51, 35, 34, 33 and 45 are formed.

Electrical isolation is provided between columns of floating gates by Shallow Trench Isolation (STI). The exposed substrate surface is anisotropically etched to form trenches 97-100 elongated in the y-direction and positioned between the polysilicon/dielectric stack strips in the x-direction. These trenches are etched to a depth of 100-300 nm in one embodiment. In other embodiments, trench depths of up to 1000 nm, 2000 nm or more can be used.

Additional trenches can be formed alongside the first polysilicon strips with lengths in the x-direction. Over the active regions these trenches extend the full height of the floating gate plus the thickness of masking layers 93 and 95, and over the field regions they will extend 100-200 nm. The control gate lines 81-84, select gate lines 80 and 85, and source and bit line contacts are formed in these trenches. Before forming these control gate lines, ions are implanted in the trenches, shown in the cross-sectional view of FIG. 7 as memory transistor and select gate implanted source and drain regions 67, 72, 105, 106, 62 and 57. A dielectric layer 103 is formed over the exposed surfaces of the structure, conforming to the sidewalls and bottom surfaces of the newly formed trenches. The layer 103 is ONO but may also be a material having a higher dielectric constant.

A second layer of doped polysilicon is deposited over the array area, completely filling the trenches and contacting the dielectric layer 103. This polysilicon is then removed from the top of the structure by CMP, resulting in control gate lines 81-84, the SSL line 80, and the DSL line 85. These lines are made to extend at least as high as the floating gates to which they are capacitively coupled through the dielectric layer 103.

Figure 10:
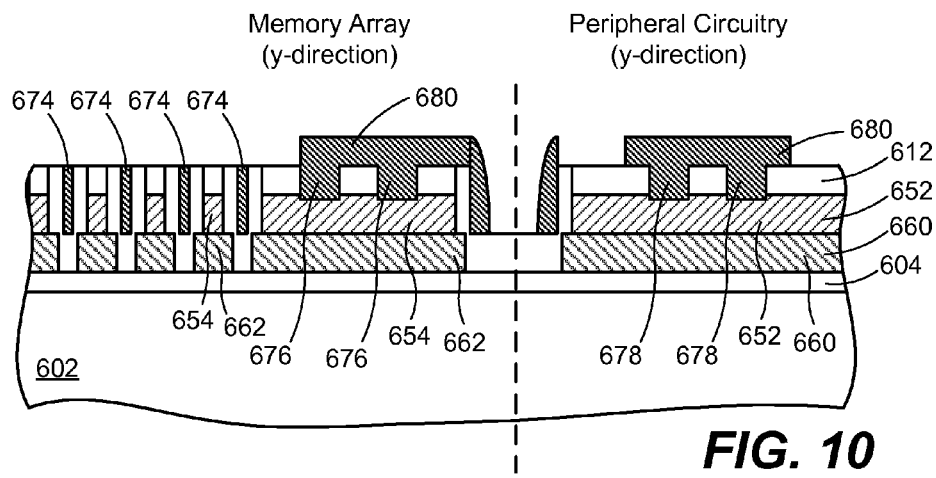
FIG. 10 is an orthogonal cross-sectional view through a portion of a NAND string of flash memory cells in accordance with one embodiment.

FIG. 10 is a cross-sectional view in the column or y-direction through a portion of a non-volatile memory formed using substrate 602, illustrating a peripheral circuitry portion of the substrate in addition to the memory array region. Tunnel dielectric layer 604 is formed across the surface of substrate 602 at the memory array region and peripheral circuitry region. The memory array region includes a cell area, a portion of which is depicted in FIG. 10 that includes four memory cells. Each memory cell includes a composite charge storage structure having a first charge storage region 662 and a second charge storage region 654. The composite charge storage structures are separated from the substrate surface by the tunnel dielectric layer. A set of control gates are formed between charge storage structures that are adjacent in the column direction and after the end charge storage structures on both ends of the string of cells (only of which is depicted).

A select gate transistor for the adjacent string of memory cells is also formed at the memory array region 690. The select gate transistor includes a gate region with components 662 and 654 formed from the first and second charge storage layers respectively. The gate region dimension in the column direction of the select gate transistor is much larger than that of the memory cells. Shorts 676 formed from the control gate layer connect to the gate region at component 654, thereby forming a single gate device. An optional second layer 680 of control gate material is included.

The peripheral circuitry region 692 of the substrate includes a transistor having a gate region formed of components 660 and 652 from the first and second charge storage layers. Like the select gate transistor, the gate region of the peripheral transistor has a much larger dimension in the column direction that that of the memory cells. The gate region is connected to the second control gate layer by shorts 678 to again form a single gate device with no floating gate.

Figure 11:
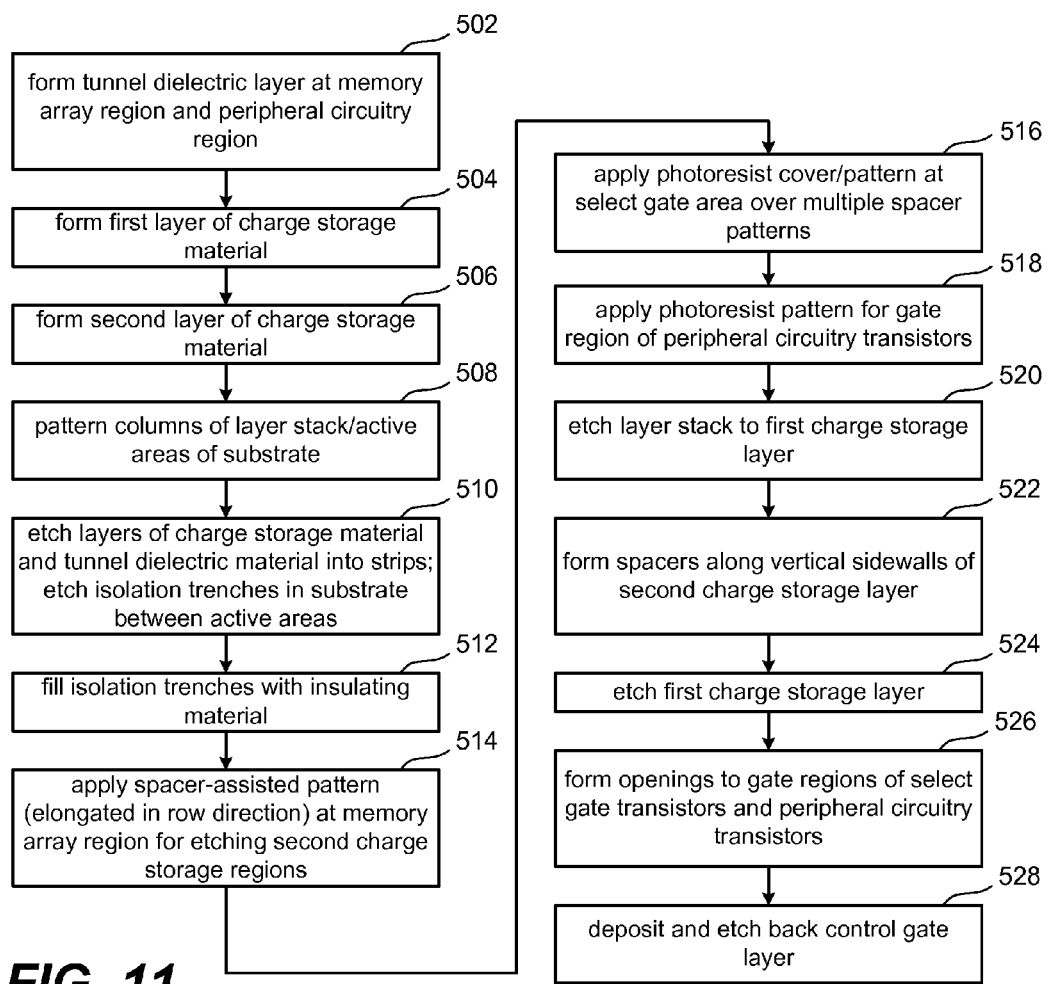
FIG. 11 is a flowchart describing a method of fabricating non-volatile flash memory in accordance with one embodiment.

FIG. 11 is a flowchart describing a method of fabricating a non-volatile memory system in accordance with one embodiment of the disclosed technology, including select gate transistor and peripheral circuitry formation associated with the fabricated memory array. Select processing steps are presented with common processing operations omitted so as to highlight key portions of the process without being obscured by standard operations that are well-known to those of ordinary skill in the art.

At step 502, a tunnel dielectric layer is formed over the surface of a substrate at a targeted memory array region and peripheral circuitry region. One or more areas of the peripheral circuitry region may undergo additional processing to form a thicker dielectric for transistors such as logic gates, high voltage select transistors, etc. A first charge storage layer is formed over the dielectric layer at step 504, followed by forming a second charge storage layer at step 506. Additional padding and hard masking layers are generally applied, prior to applying a pattern at the memory array region at step 508 that corresponds to the targeted columns of the layer stack and active areas of the substrate. Spacer-assisted patterning can be used. At the peripheral circuitry region, a different pattern is applied corresponding to one or more targeted column(s) of the layer stack and active areas of the substrate at that region. Generally, the memory array region is patterned using spacer-assisted patterning, followed by patterning the peripheral circuitry region using conventional photolithography techniques. The layer stack is etched at step 510, followed by etching isolation trenches in the substrate between active areas and the overlying columns of the layer stack. The trenches are filled with an insulating dielectric material at step 512.

Spacer-assisted patterning is used at step 514 to form a pattern at the memory array region for etching the second charge storage layer. The pattern is a repeating pattern in the column direction, extending in the row direction perpendicular to the earlier applied patterning. The patterning applied at step 514 is applied at the cell area and the select gate areas of the array region. In order to fabricate larger devices at the select gate area, photoresist or another suitable technique is used to cover the select gate area at step 516. The photoresist is applied over the spacer-assisted pattern formed in step 514. Step 516 includes covering multiple spacers that correspond to the second charge storage region dimension. Covering the select gate area patterns one side of the select gates. At step 518, photoresist is applied at the peripheral circuitry area to pattern the gate regions for the peripheral circuitry transistors.

At step 520, the layer stack is etched until reaching the desired depth of the second charge storage regions, which may or may not necessarily coincide with the respective depths of each charge storage layer. A unique order of etching and removing the protective pattern at the select gate area is presented hereinafter. Etching the second charge layer at the array region divides the columns thereof into a plurality of second charge storage regions. At the select gate area, the protective pattern causes the second charge storage layer to be etched into a second gate region for the select gate. By applying the protective pattern over multiple spacers, the second gate region of the select transistor has a larger dimension in the column direction than the second charge storage regions of the memory cells. At the peripheral circuitry region, the applied pattern causes the second charge storage layer to be etched into a second gate region for the peripheral transistors. The second gate region has a larger dimension in the column direction that the second charge storage regions.

At step 522, spacers are formed on the sidewalls of the second charge storage regions at the cell area and the second gate regions at the peripheral and select gate areas. The spacers extend the dimension of the second gate or charge storage regions in the column direction. Using the spacers as a mask at step 524, the first charge storage layer is etched to form a plurality of first charge storage regions at the memory array region, a first gate area for the select gates at the select gate area and a first gate area for the peripheral gate transistors at the peripheral circuitry region.

An intermediate dielectric layer is formed at step 526. The intermediate dielectric is formed over the tunnel dielectric layer between adjacent first charge storage regions and along the sidewalls of at least a portion of the second charge storage regions. A space exists between adjacent second charge storage regions after forming the dielectric layer. At step 528, openings to the second gate region of the select gate transistors and peripheral circuitry transistors are formed. At step 530, a control gate layer is deposited and etched back, forming control gates at the memory array region. The control gates at least partially fill the spaces between adjacent second charge storage regions. Each control gate is separated from the adjacent charge storage region(s) by the intermediate dielectric layer. Each control gate is separate from the substrate by the tunnel dielectric layer and the intermediate dielectric layer. The control gate layer fills the openings at the select gate area and the peripheral circuitry region. The control gate layer is shorted to the floating gate layer so that single gate devices are formed without floating gate regions. It is noted that while the described embodiment includes a composite charge storage structure with first and second charge storage regions, the techniques can be applied to traditional charge storage structures including a single charge storage region.

Figure 12E:
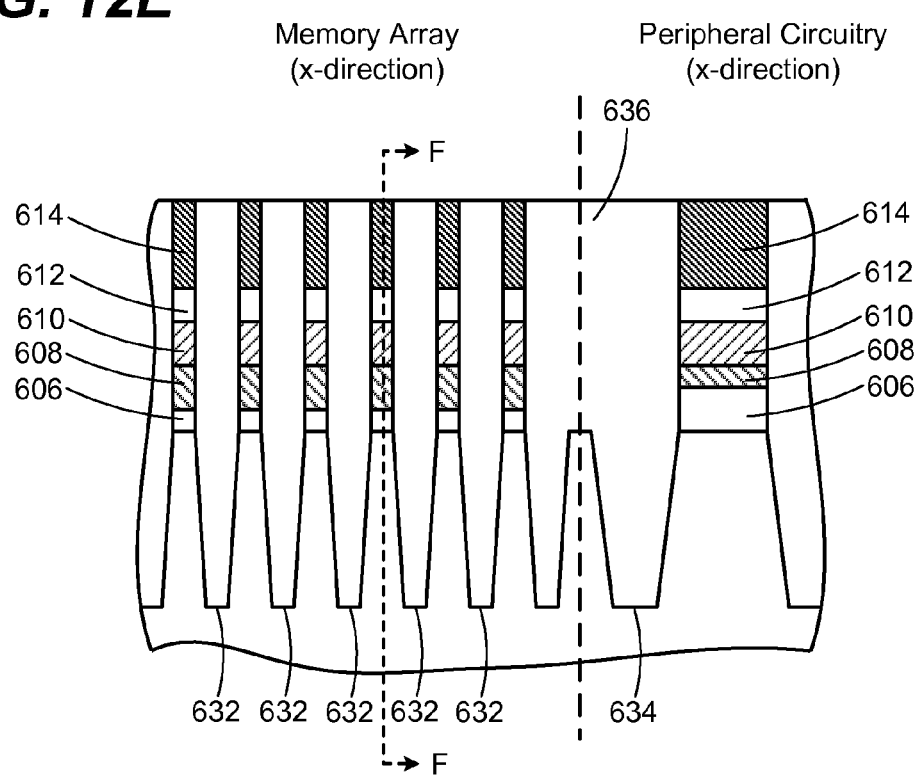
FIGS. 12A-12Q are orthogonal cross-sectional views through a portion of a non-volatile memory array fabricated in accordance with one embodiment using post-isolation cell formation that integrates peripheral and select circuitry formation.
Figure 12F:
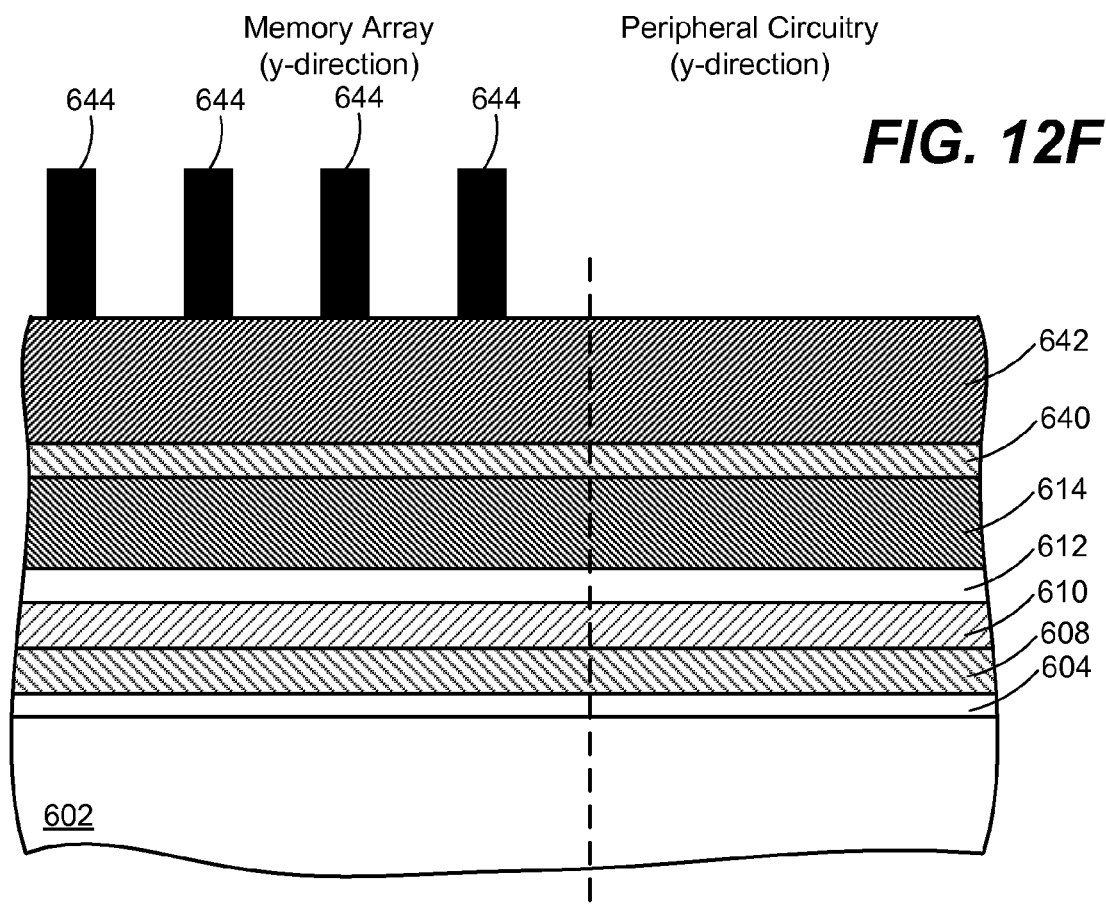
Figure 12G:
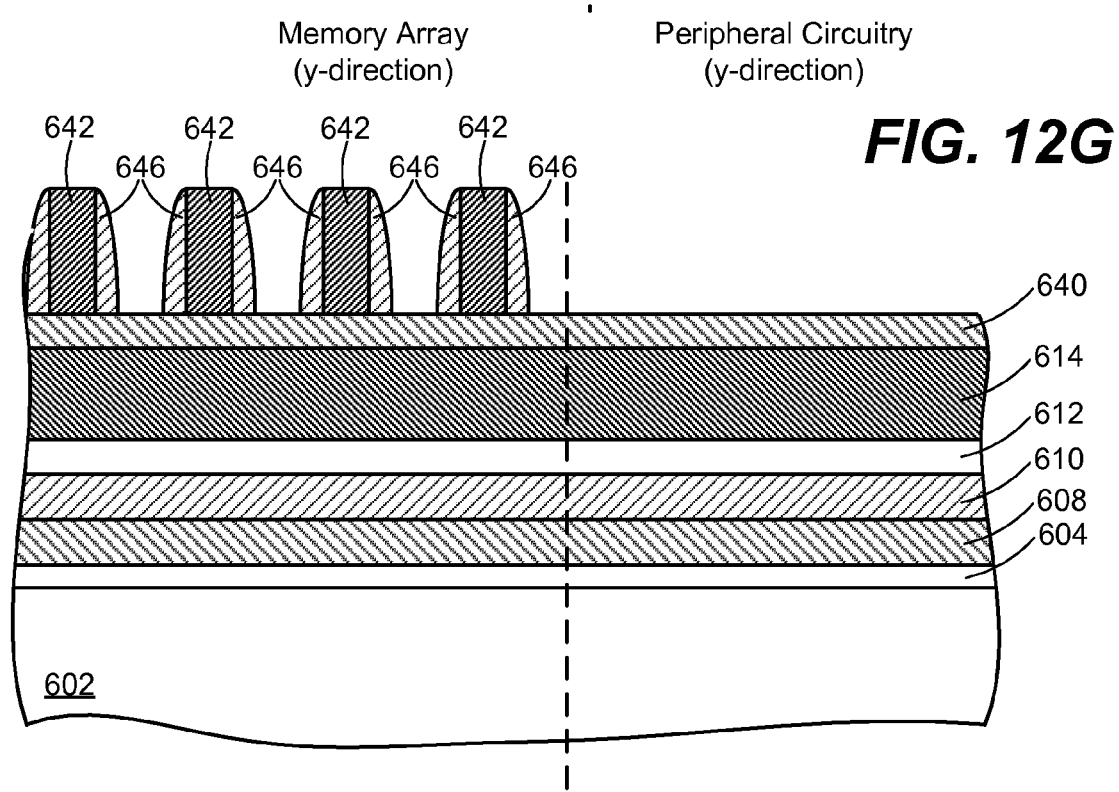
Figure 12H:
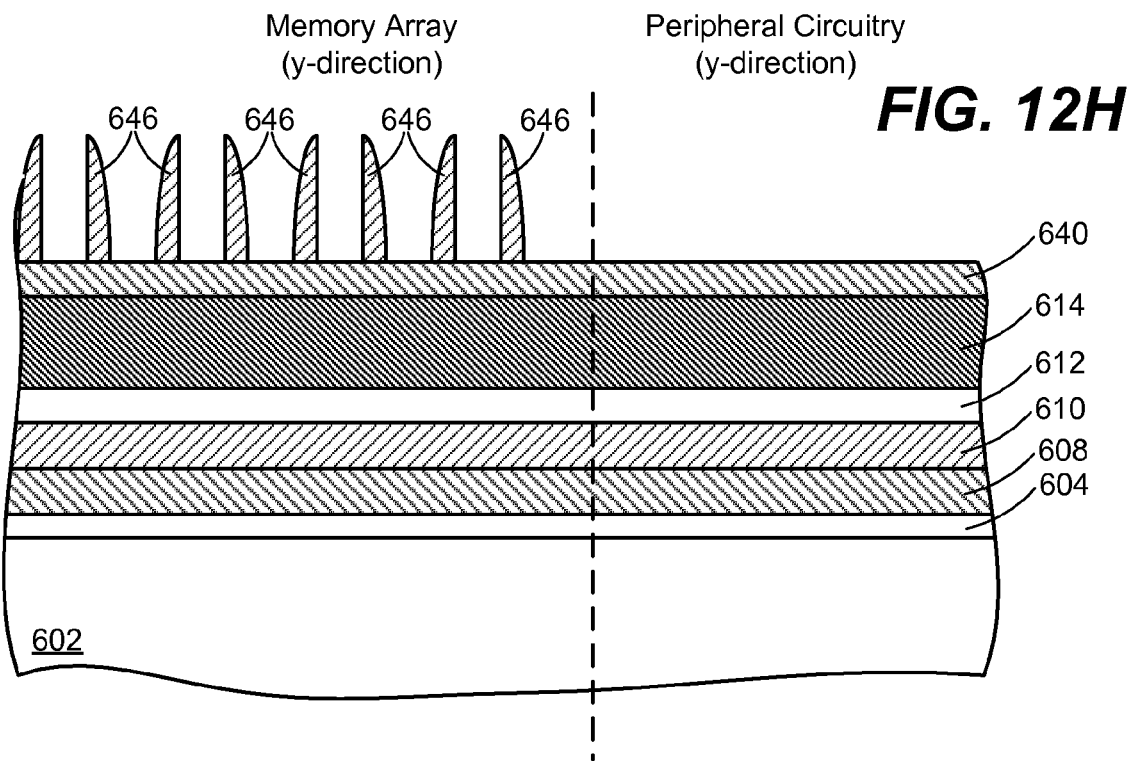
Figure 12I:
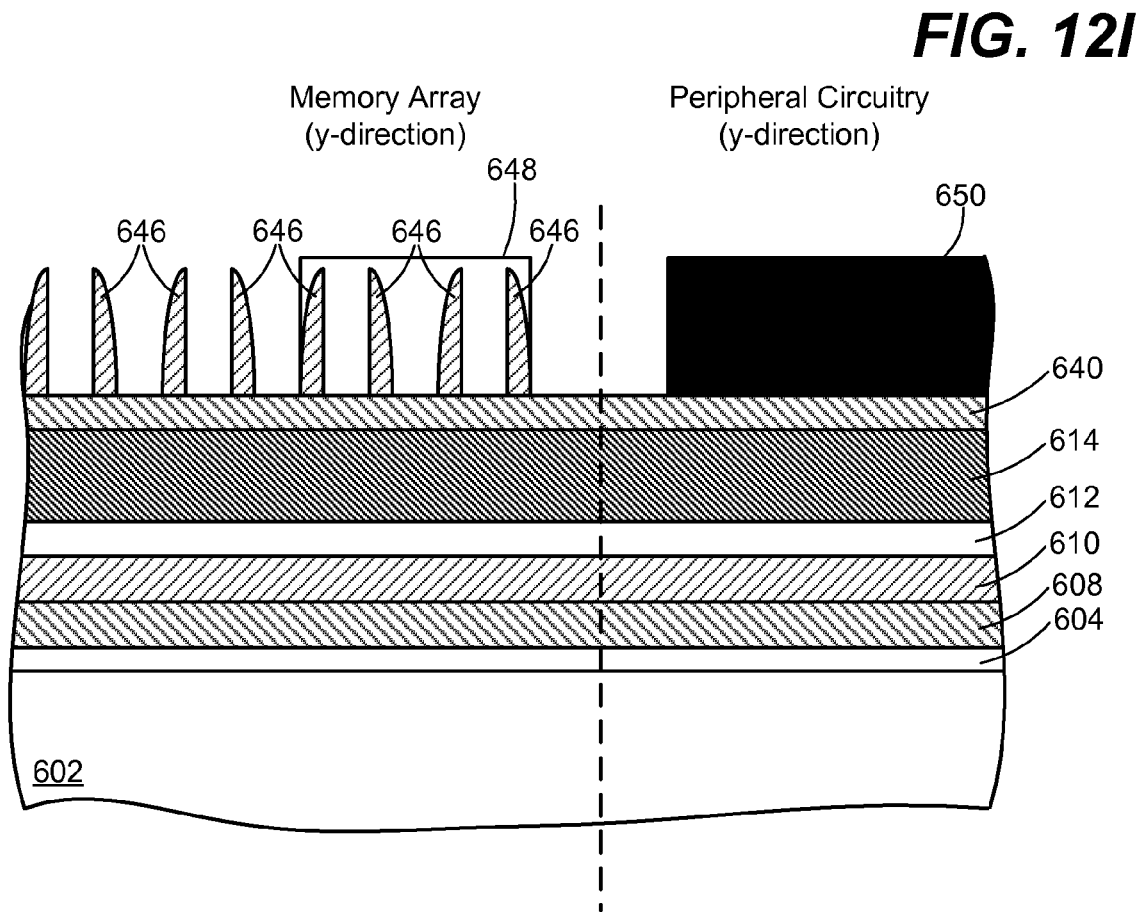
Figure 12J:
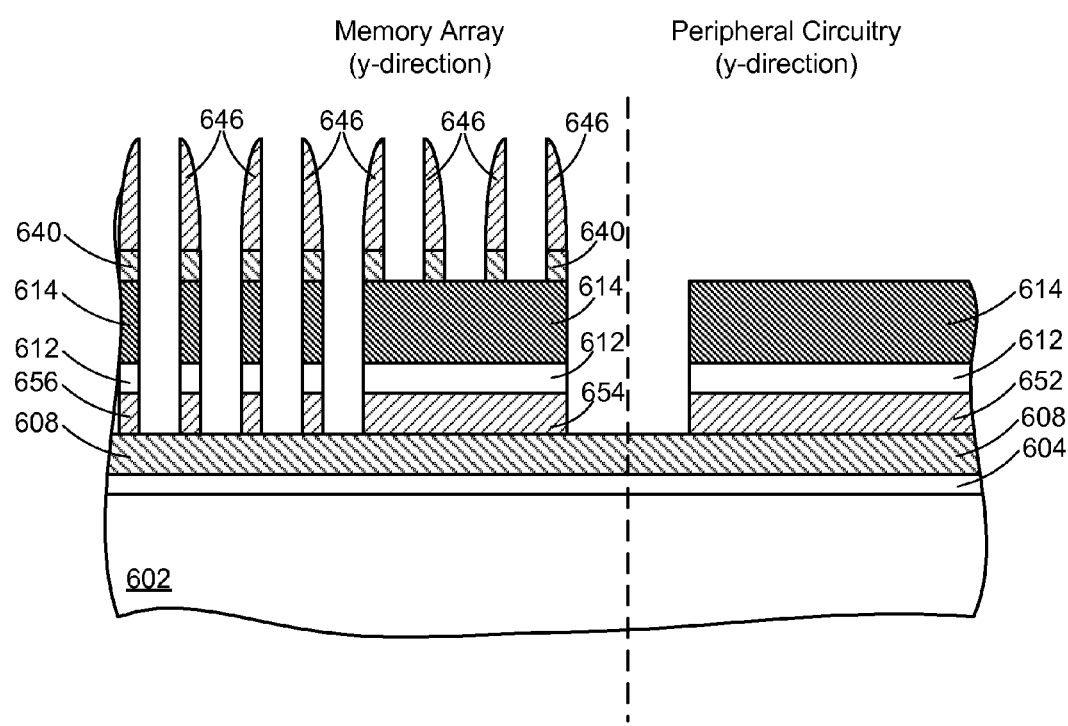
Figure 12K:
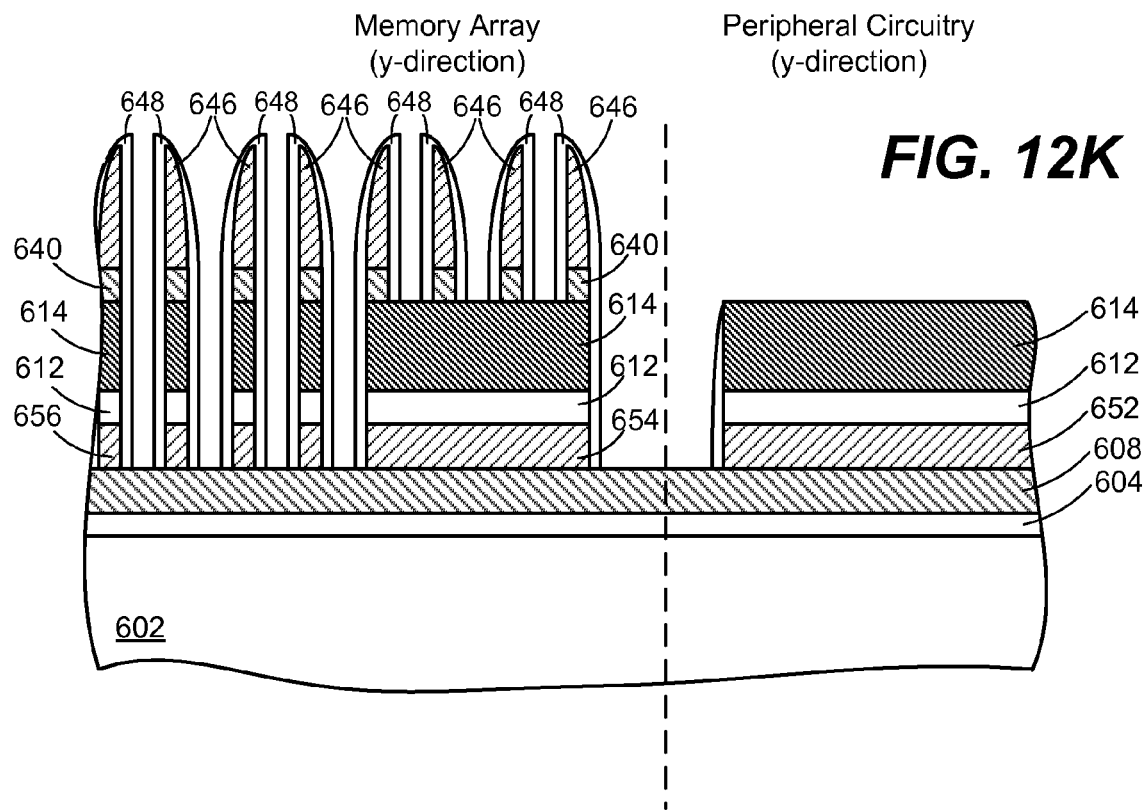
Figure 12L:
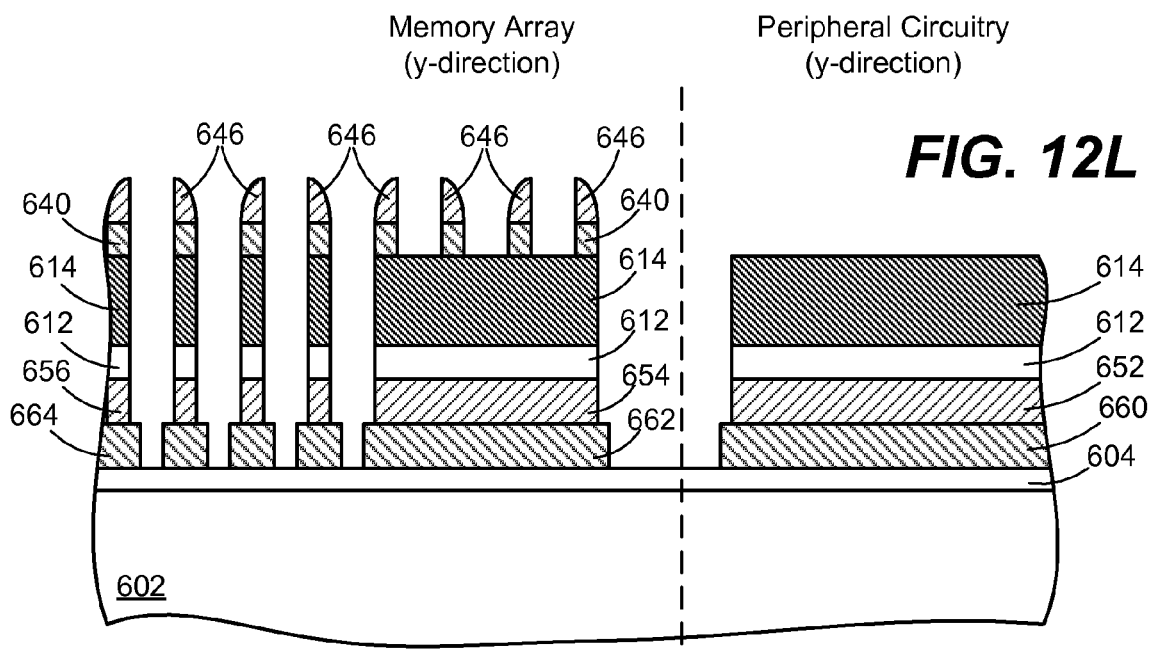
Figure 12M:
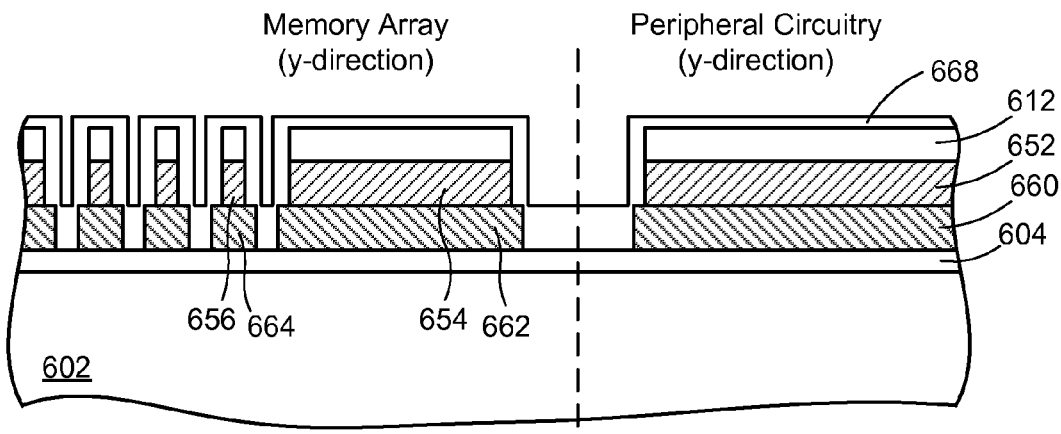
Figure 12N:
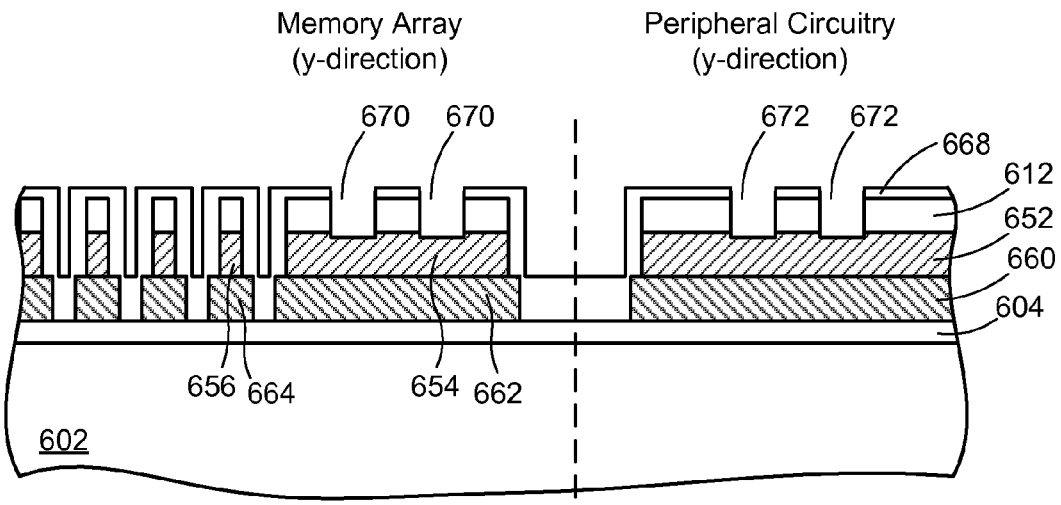

FIGS. 12A-12N are orthogonal cross-sectional views of portions of a non-volatile memory system depicting the fabrication of a memory array and peripheral circuitry in accordance with one embodiment of the disclosed technology. The depicted device includes memory cells with dual control gate structures and composite charge storage structures having an inverted-T shape. The described embodiment is exemplary only and its precise form should not be taken as limiting the disclosure. The exact materials, dimensions and order of processing may vary according to the requirements of a particular implementation. It is noted that the dimensions of the various features are not necessarily drawn to scale in these figures.

FIG. 12A is a cross-sectional view through a line such as line B-B of FIG. 6 in the row or x-direction. FIG. 12A depicts a portion of the memory array as well as a peripheral circuitry portion of the substrate. The peripheral circuitry portion can include circuitry such as high voltage transistors, logic transistors, etc. that form part of the row or column control circuitry for the memory array. Although not depicted, one or more wells (e.g., a triple well) are typically formed in a substrate prior to forming the layer stack over the substrate surface. A zero layer formation step may precede well formation. After implanting and associated annealing of the well(s) to dope the substrate, a high voltage gate dielectric region 606 is formed in the substrate. The gate dielectric extends in the column direction across the substrate and in one embodiment, is formed by growing a thick layer of SiO2 to an exemplary depth of about 340 A-380 A. Deposition processes could alternately be used to form the dielectric region 606, for example by depositing the oxide and patterning and etching to remove oxide from undesired areas of the substrate.

A layer 604 of tunnel dielectric material is formed over the substrate surface after forming the gate oxide region. A thin layer of oxide (SiO2) is grown in one embodiment although different materials and processes can be used for the tunnel dielectric. A first layer 608 of charge storage material is formed over the substrate surface after forming the gate and tunnel dielectrics. The first layer is formed over the surface of the substrate at both the memory array region and the peripheral circuitry region of the substrate. At the memory array region, the first layer is separated from the substrate surface by the tunnel dielectric layer 604. At the peripheral circuitry region, the first layer is separated from the substrate surface by the gate dielectric region 606. It is noted that a layer may said to be over another layer when one or more intervening layers are between the two layers, as well as when the two layers are in direct contact. The first charge storage layer can be doped polysilicon, undoped polysilicon, a dielectric charge storage material, or other suitable material. Different thicknesses can be used for the first charge storage layer. By way of non-limiting example, one embodiment includes a 400 A thickness for the first charge storage layer. In another, a 200 A thickness is used. For ease of explanation, reference may be made to specific dimensions and/or materials hereinafter but it will be appreciated that these may vary as noted.

A second charge storage layer 610 is formed over the substrate surface at the array and peripheral regions of the substrate. The second charge storage layer overlies the first charge storage layer at the array region and the peripheral region of the substrate. Like the first charge storage layer, the second can include doped polysilicon, undoped polysilicon, a dielectric charge storage material, or other suitable material. The second charge storage layer is not necessarily formed of the same material as the first charge storage layer, although it can be. In one embodiment, the first charge storage layer is undoped polysilicon and the second charge storage layer is doped polysilicon. The thickness of layer 610 can vary as well. In one embodiment, layer 608 and layer 610 are both 400 A. In another, layer 608 is 200 A and layer 610 is 600 A. Different relative and total thicknesses of layers 608 and 610 are contemplated.

A thin pad (e.g., SiO2) layer 612 is formed over the second layer 610 of charge storage material at the memory array region and peripheral circuitry region. A 300 A pad layer is used in one embodiment although other thicknesses can be used to suit the needs of particular implementations. Another pad (e.g., SiN) layer 614 is formed over layer 612. As noted, these two layers of formed of different materials, including an oxide and nitride in the described embodiment. Layer 614 is 800 A in one embodiment. Over the SiN pad layer is formed a second thin pad layer 616. Layer 616 is of a different material than layer 614 and is another layer of SiO2 in one embodiment deposited to a depth of about 300 A. An assist layer 618 that will match or substantially match the material composition of later formed spacers is formed over pad layer 616. This optional assist layer, for which more detail is provided hereinafter, can provide etch stop capabilities and adhesive qualities during spacer formation. A buffer layer 620, e.g., SiO2, is formed over the etch stop layer to a depth of about 1100 A in one embodiment.

A pattern for etching the layer stack of FIG. 12A is provided for forming strips of material elongated in the column direction with electrical isolation therebetween. Any suitable patterning technique can be used. In the particularly disclosed embodiment, a stacked mass process (SMAP) layer 622 is used, including a combination SOG film with a thickness of 450 A and an ODL film with a thickness of 3000 A. A pattern including photoresist strips 624 is then applied to the memory array region. One exemplary embodiment uses a target line of size of 430 A and a target space size of 850 A. The peripheral region of the substrate is not patterned.

FIG. 12B depicts the substrate after etching buffer oxide layer 620 and forming spacers on the resulting features. Photoresist strips 624 and SMAP layer 622 provide a mask for reactive ion etching of SMAP layer 622, followed by reactive ion etching of oxide layer 620. Selective etching can be used when etching oxide layer 620 so that the etch process stops when polysilicon assist layer 618 is reached. Etching through oxide layer 620 forms features 626 that are elongated across the substrate in the column direction with spaces therebetween in the row direction. Any remaining portions of the SMAP layer 622 and photoresist strips 624 are removed.

A layer of spacer material is formed over the substrate and etched back to form spacers 628 along the substantially vertical sidewalls of features 626. A layer of polysilicon is deposited using a conformal process with a target thickness of 100 A in one embodiment. The layer is etched back to form spacers 628 with a dimension in the row direction approximately equal to the target thickness 100 A. Etching back the polysilicon exposes the underlying etch stop layer 618 at portions not covered by features 626 or spacers 628. Etching removes the polysilicon from the peripheral circuitry area.

FIG. 12C depicts the substrate after removing the buffer oxide features 626, using a chemical wet etch for example to strip the oxide from the surface of the polysilicon etch stop layer. The resulting spacers 628 form a mask over the layer stack for forming active areas in the substrate at the memory array area with electrical isolation therebetween. The assist layer 618 can provide a number of functions in the spacer-formation process. First, the assist layer can provide an etch stop for the wet etch process used to strip the sacrificial features. The assist layer can also provide a stable base for the subsequently formed spacers. For example, the material composition of the assist layer is chosen to provide adequate adhesion for the thinly formed spacers. A matched material composition for the spacers and assist layer facilitates adhesion between the spacers and the underlying layer. For example, the assist layer and spacer material are both polysilicon in one embodiment to improve the stability of the spacers when the sacrificial features are removed. Similar materials that are not exactly the same may also be used to improve adhesion of the spacers to their base layer. Using similar materials for the spacers and intervening layer can also help with stresses between the different films. If layers of different materials are used, the different materials may have different coefficients of thermal expansion causing stress at the interface of the different materials. When the same or similar materials are used, matching thermal coefficients can decrease stresses at the material interfaces. More details regarding the use of an assist layer 618 can be found in U.S. patent application Ser. No. 11/623,314, entitled "Method Of Forming Spacer Patterns Using Assist Layer for High Density Semiconductor Devices," by Pham, et al., filed Jan. 15, 2007.

In FIG. 12C, a pattern 630 has also been applied to the peripheral circuitry area after removing the oxide from the memory array area. The pattern is a strip of photoresist elongated in the column direction across the substrate. The strip of photoresist overlies the area of the peripheral region to become an active area, leaving exposed other portions of the peripheral region for forming electrical isolation. Although a single strip of photoresist is depicted in FIG. 12C, multiple strips for forming additional active regions in the peripheral area of the substrate can be patterned as shown in FIG. 12C.

FIG. 12D depicts the substrate after etching the layer stack and substrate using spacers 628 and photoresist 630 as a pattern. The assist layer 618 is etched, followed by etching the second oxide pad layer 616 and nitride pad layer 614. Etching through nitride layer 614 consumes all or substantially all of the polysilicon spacer material 628. Next, the first oxide pad layer 612 is etched, consuming the entire second oxide pad layer at those locations under spacers 628. The two charge storage layers 608 and 610 are then etched, consuming a portion of nitride pad layer 614. Etching the layer stack completes by etching through the tunnel dielectric layer 604 at the array region and the gate dielectric region 606 at the peripheral circuitry region. With the layer stack divided into strips of charge storage material elongated in the column direction, the substrate is etched between the active areas in the substrate below the strips so formed. In one exemplary embodiment, the substrate is etched to a depth of about 2200 A, although different dimensions will be suitable to different applications. Etching will consume another portion of the nitride pad layer 614. In the embodiment shown, about 400 A of nitride layer 614 remains after etching. Etching the substrate results in isolation trenches 632 at the memory array region between stacked strips adjacent in the row direction. At the peripheral circuitry region, etching results in trenches 634 adjacent to the stacked strips.

After forming the isolation trenches, a layer of insulating material such as SiO2 is used to fill the trenches as shown in FIG. 12E. An insulating dielectric is deposited in one embodiment to completely fill the trenches and the open areas between adjacent columns of the stacked layers. Chemical mechanical polishing or another suitable technique such as etching can be used to create a substantially planar surface after filling the trenches.

FIG. 12F is a cross-sectional view taken along line F-F of FIG. 12E through a single layer stack strip after forming isolation trenches and filling with an insulator. FIG. 12F also depicts the substrate after forming another assist layer 640 and layer 642 of sacrificial material such as SiN. The assist layer is polysilicon in one embodiment to assist in the later formation of polysilicon spacers. Additionally, a pattern comprised of strips 644 of photoresist is formed at the array region to begin forming individual charge storage regions from the strips of charge storage material. The strips of photoresist are used as a pattern for etching the sacrificial nitride layer into sacrificial strips as shown in FIG. 12G. The strips are elongated across the substrate in the row direction with spaces therebetween in the column direction. Because no pattern was applied, etching completely removes the nitride layer from the peripheral circuitry area.

After etching, the strips of photoresist are removed and a layer of spacer material is deposited and etched back to form spacers 646, also shown in FIG. 12G. A conformal process is used to deposit a layer of polysilicon with a target thickness of about 100 A in one embodiment. After forming spacers 646, the sacrificial nitride features are removed as depicted in FIG. 12H, using a chemical wet etch for example.

Before etching the layer stack using the spacers as a mask, the peripheral circuitry area is covered with a mask of photoresist 650 to protect the underlying layers from etching as shown in FIG. 12I. Additionally, one side of the select gate for the adjacent column of memory cells is patterned. A strip 648 of photoresist is applied over that portion of the memory array to become the select gate. In the depicted example, the select gate is to have a dimension in the column direction substantially larger than that of the floating gate regions of the memory cells. The photoresist pattern covers four of the spacers 646 in the column direction, corresponding to the targeted select gate area.

After patterning the select gate and peripheral circuitry with photoresist, the layer stack is etched to form the structure depicted in FIG. 12J. Reactive ion etching is used to etch through the polysilicon etch stop layer 640. After etching layer 640, the photoresist is removed from the select gate and peripheral circuitry areas. The remaining layer stack is then etched. The nitride pad layer 614 is first etched. The polysilicon layer 640 remaining at the select gate and peripheral circuitry areas protects these regions from being etched. A reactive ion etch is then used to etch the oxide pad layer 612. Etching the nitride and oxide layers can include using a longer etch at both steps to recess the field oxide and prevent a possible stringer of SiN. A final etch process is used to etch the second layer 610 of charge storage material. The final etch process forms individual charge storage regions 656 from the strip of charge storage material at the array region, a gate region 654 at the select gate area and a gate region 652 at the peripheral circuitry region. Etching the charge storage layer 610 also removes the assist layer from the peripheral region and also from the areas between spacers 646 at the select gate area. Etching the second charge storage layer 610 can be a timed process set to end at about the time layer 610 is etched through. In another embodiment, a detectable etch stop layer, e.g., a metal such as TiN, is formed between layers 608 and 610. Rather than using a timed process, etching can be stopped when the etch stop material is detected. More details regarding etching the second charge storage layer 610 can be found in U.S. patent application Ser. No. 11/960,498 entitled, "Composite Charge Storage Structure Formation In Non-Volatile Memory Using Etch Stop Technologies," filed Dec. 19, 2007, incorporated by reference herein in its entirety.

A layer of spacer material is deposited over the substrate and etched back as shown in FIG. 12K, forming a set of spacers 648 along the sidewalls of the etched layer stack. The spacers are SiN in one embodiment, which can be deposited with a target thickness of about 90A. Using the nitride spacers 648 as a mask, the first charge storage layer 608 is etched as shown in FIG. 12L. Etching proceeds until the tunnel dielectric layer 604 is reached. The first charge storage layer is divided into a plurality of first charge storage regions 664 at the array region, a gate region 662 at the select gate area, and a gate region 660 at the peripheral circuitry region. A wet etch process can be used to remove the nitride spacers after etching. The wet etch will also remove any residual portions of nitride layer 614 and the overlying layers.

An intermediate dielectric layer 668 is formed over the substrate as shown in FIG. 12M. A triple layer of ONO is deposited in one embodiment to form the intermediate dielectric layer. A pattern of photoresist is then applied to open up the oxide layer 612 at the select gate area and peripheral circuitry area. The cell regions can be protected while etching openings 670 at the select gate area and openings 672 at the peripheral circuitry region as shown in FIG. 12N. The openings reach to the gate regions 654 and 652. At the select gate area, openings 670 can be trenches elongated in the row direction across the substrate. At the peripheral circuitry region, openings 672 can either be single contact holes to form single contacts to individual gates, or trenches so that two or more gate regions 652 can be connected to a single control line.

Figure 12O:
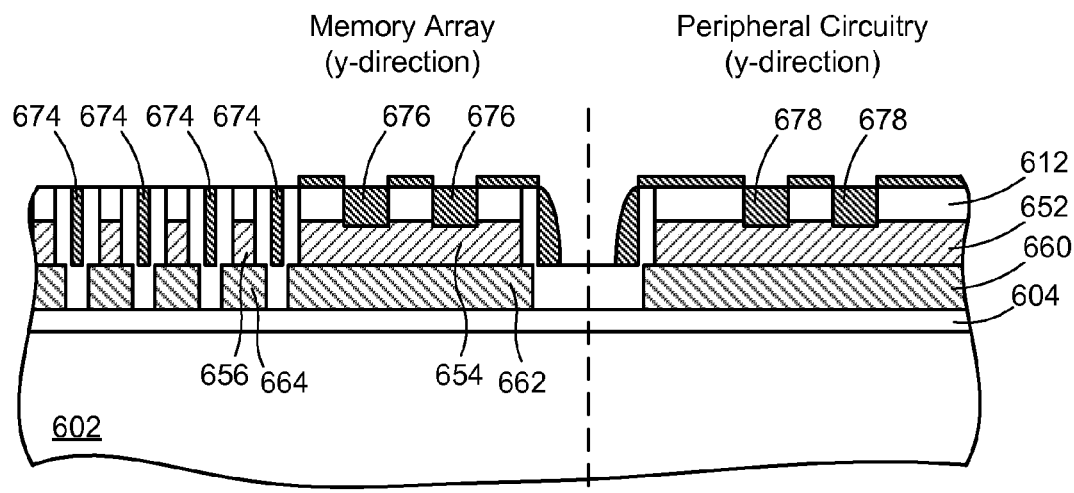
Figure 12P:
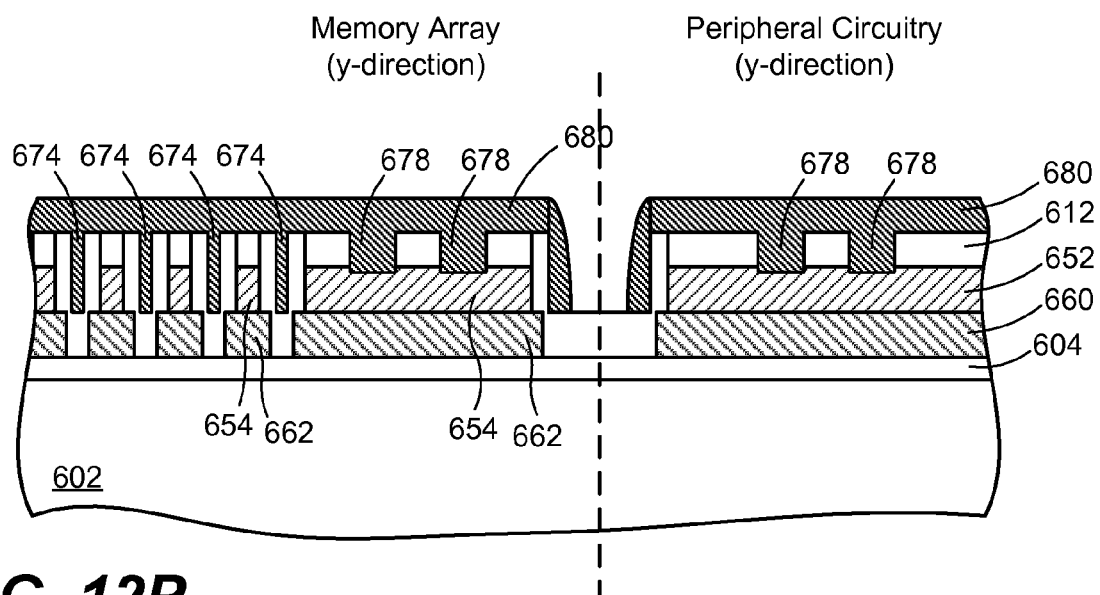
Figure 12Q:
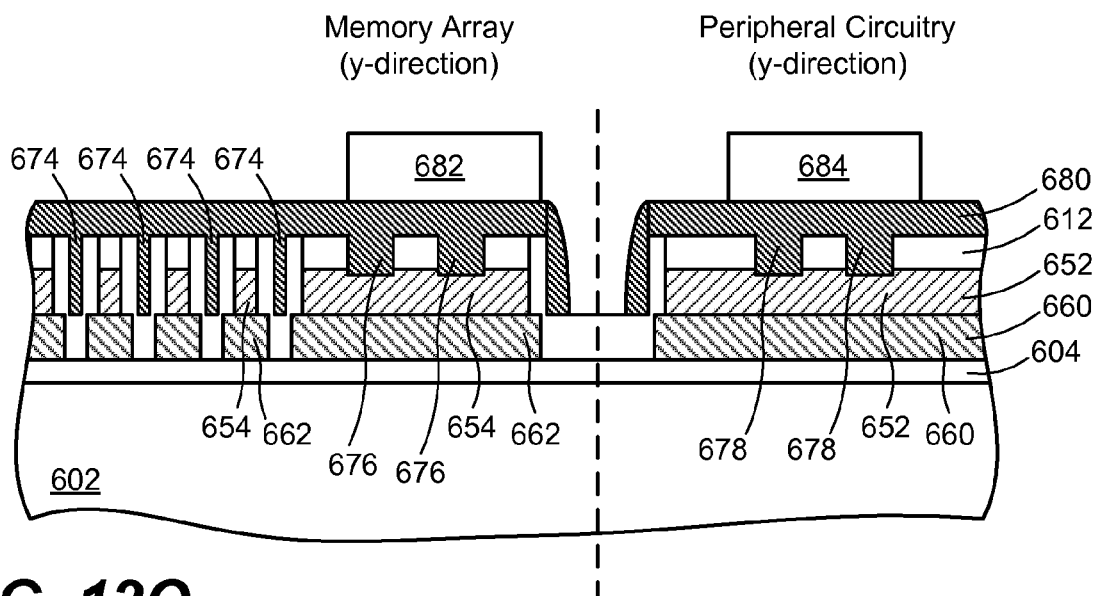

A layer of conductive control gate material, e.g., polysilicon, is then deposited and etched back as shown in FIG. 12O. At the cell region, control gates 674 are formed. The control gates are formed in between adjacent charge storage regions 656 and extend across the substrate in the row direction, intrinsically forming word lines for the array. The control gates are separated from the adjacent charge storage regions by the intermediate dielectric layer 668. At the select gate area, the control gate layer fills openings 670, forming shorts 676 to gate area 654, shorting the control gate and charge storage layers to form a single gate transistor. The control gate layer shorts are elongated in the row direction, forming a common selection line for a row of select gates. The control gate layer fills openings 678 at the peripheral circuitry region, forming shorts 678 to charge storage region 652. An optional second control gate layer 680 is formed over the substrate as shown in FIG. 12P. Strips 682 and 684 of photoresist are patterned over the select gate and peripheral circuitry areas as shown in FIG. 12Q. The second control gate layer is then etched to form the device depicted in FIG. 10. Continued processing, including processing of metal layers and contacts etc. is then performed, including forming contacts to word lines, etc.

Figure 13:
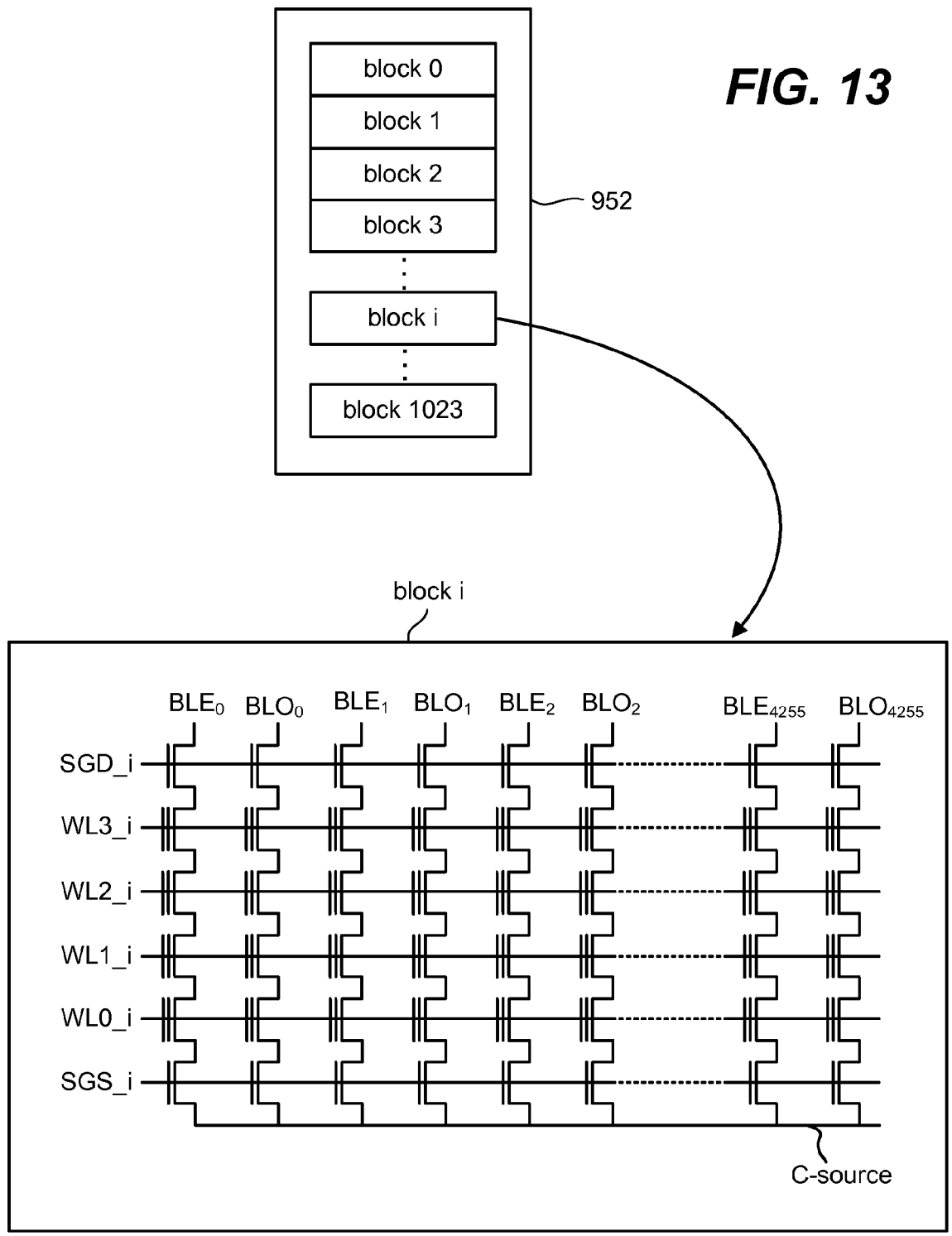
FIG. 13 depicts an exemplary organization of a memory array in accordance with one embodiment.

FIG. 13 depicts an exemplary structure of a memory cell array 952 that can be fabricated using one or more embodiments of the disclosed technology. As one example, a NAND flash EEPROM is described that is partitioned into 1,024 blocks. The data stored in each block can be simultaneously erased. In one embodiment, the block is the minimum unit of cells that are simultaneously erased. In each block, in this example, there are 8,512 columns that are divided into even columns and odd columns. The bit lines are also divided into even bit lines (BLE) and odd bit lines (BLO). FIG. 13 shows four memory cells connected in series to form a NAND string. Although four cells are shown to be included in each NAND string, more or less than four can be used (e.g., 16, 32, or another number). One terminal of the NAND string is connected to a corresponding bit line via a first select transistor (also referred to as a select gate) SGD, and another terminal is connected to c-source via a second select transistor SGS.

During read and programming operations for memory cells of one embodiment, 4,256 memory cells are simultaneously selected. The memory cells selected have the same word line (e.g. WL2-$i$), and the same kind of bit line (e.g. even bit lines). Therefore, 532 bytes of data can be read or programmed simultaneously. These 532 bytes of data that are simultaneously read or programmed form a logical page. Therefore, in this example, one block can store at least eight pages. When each memory cell stores two bits of data (e.g. a multi-level cell), one block stores 16 pages. In another embodiment, a memory array is formed that utilizes an all bit-line architecture such that each bit line within a block is simultaneously selected, including those adjacent in the x-direction.

In other embodiments, the bit lines are not divided into odd and even bit lines. Such architectures are commonly referred to as all bit line architectures. In an all bit line architecture, all the bit lines of a block are simultaneously selected during read and program operations. Memory cells along a common word line and connected to any bit line are programmed at the same time. In other embodiments, the bit lines or block can be broken up into other groupings (e.g., left and right, more than two groupings, etc.).

Figure 14:
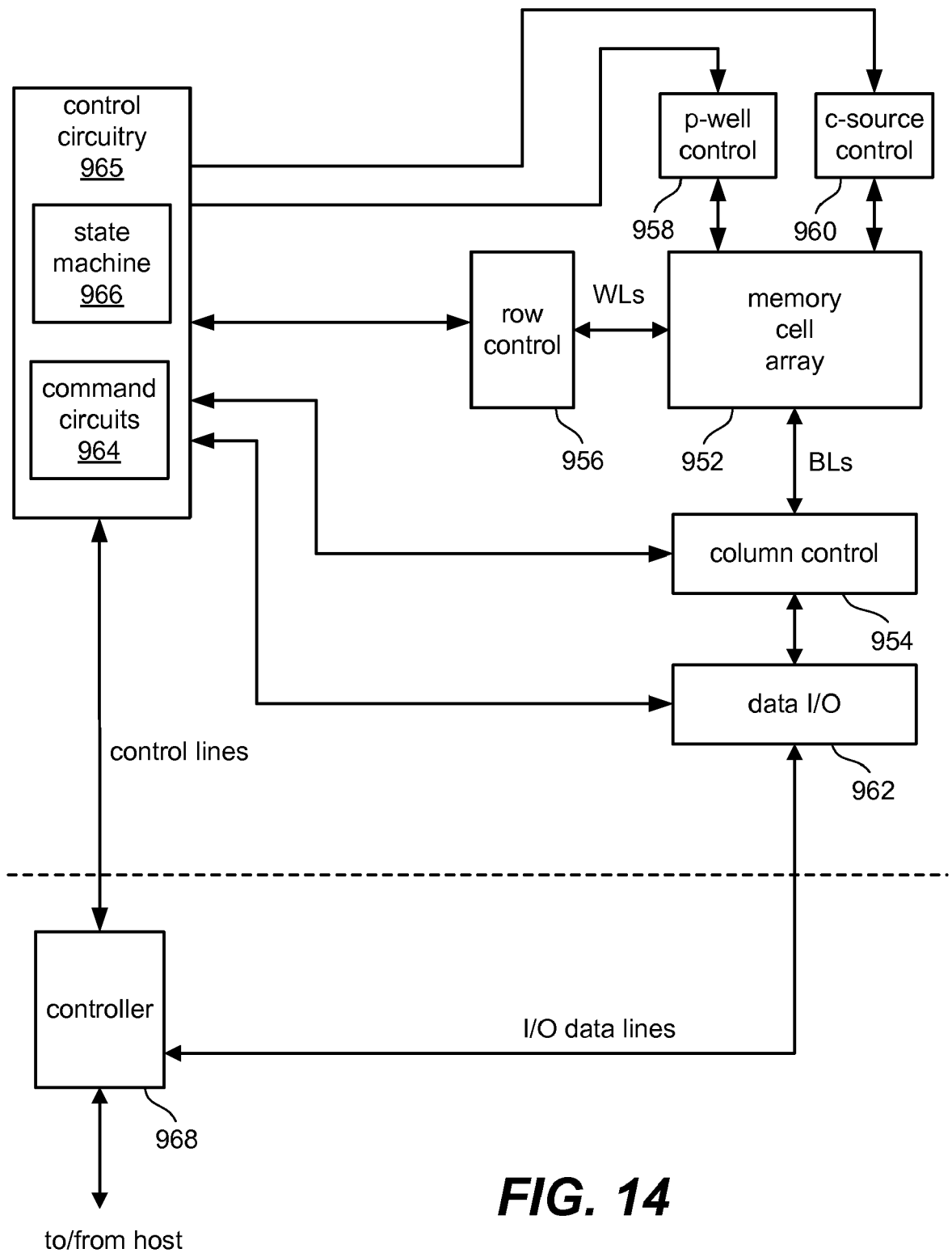
FIG. 14 is a block diagram of an exemplary memory system that can be used to implement embodiments of the disclosed technology.

FIG. 14 is a block diagram of one embodiment of a flash memory system that can be used to implement one or more embodiments of the present disclosure. Other systems and implementations can also be used. Memory cell array 952 is controlled by column control circuit 954, row control circuit 956, c-source control circuit 960 and p-well control circuit 958. Column control circuit 954 is connected to the bit lines of memory cell array 952 for reading data stored in the memory cells, for determining a state of the memory cells during a program operation, and for controlling potential levels of the bit lines to promote or inhibit programming and erasing. Row control circuit 956 is connected to the word lines to select one of the word lines, to apply read voltages, to apply program voltages combined with the bit line potential levels controlled by column control circuit 954, and to apply an erase voltage. C-source control circuit 960 controls a common source line connected to the memory cells. P-well control circuit 958 controls the p-well voltage.

The data stored in the memory cells are read out by the column control circuit 904 and are output to external I/O lines via data input/output buffer 962. Program data to be stored in the memory cells are input to the data input/output buffer 962 via the external I/O lines, and transferred to the column control circuit 954. The external I/O lines are connected to controller 968.

Command data for controlling the flash memory device is input to controller 968. The command data informs the flash memory of what operation is requested. The input command is transferred to state machine 966 which is part of control circuitry 965. State machine 966 controls column control circuit 954, row control circuit 956, c-source control 960, p-well control circuit 958 and data input/output buffer 962. State machine 966 can also output status data of the flash memory such as READY/BUSY or PASS/FAIL.

Controller 968 is connected to or connectable with a host system such as a personal computer, a digital camera, or personal digital assistant, etc. It communicates with the host that initiates commands, such as to store or read data to or from the memory array 952, and provides or receives such data. Controller 968 converts such commands into command signals that can be interpreted and executed by command circuits 964 which are part of control circuitry 965. Command circuits 964 are in communication with state machine 966. Controller 968 typically contains buffer memory for the user data being written to or read from the memory array.

One exemplary memory system comprises one integrated circuit that includes controller 968, and one or more integrated circuit chips that each contain a memory array and associated control, input/output and state machine circuits. There is a trend to integrate the memory arrays and controller circuits of a system together on one or more integrated circuit chips. The memory system may be embedded as part of the host system, or may be included in a memory card (or other package) that is removably inserted into the host systems. Such a card may include the entire memory system (e.g. including the controller) or just the memory array(s) with associated peripheral circuits (with the controller or control function being embedded in the host). Thus, the controller can be embedded in the host or included within the removable memory system.

Various features and techniques are presented with respect to the NAND flash memory architecture. It will be appreciated from the provided disclosure that implementations of the disclosed technology are not so limited. By way of non-limiting example, embodiments in accordance with the present disclosure can provide and be used in the fabrication of a wide range of semiconductor devices, including but not limited to logic arrays, volatile memory arrays including SRAM and DRAM, and non-volatile memory arrays including both the NOR and NAND architecture.

The foregoing detailed description has been presented for purposes of illustration and description. It is not intended to be exhaustive or to limit the subject matter claimed herein to the precise form(s) disclosed. Many modifications and variations are possible in light of the above teachings. The described embodiments were chosen in order to best explain the principles of the disclosed technology and its practical application to thereby enable others skilled in the art to best utilize the technology in various embodiments and with various modifications as are suited to the particular use contemplated. It is intended that the scope of the invention be defined by the claims appended hereto.

What is claimed is:

1. A method of making a non-volatile memory using a semiconductor substrate, the method comprising:
    forming a first layer of dielectric material over a surface of the substrate;
    forming a set of strips of charge storage material elongated in a first direction over the surface of the substrate with the first layer of dielectric material therebetween;
    forming a set of strips of one or more additional layers over the first set of strips of charge storage material;
    forming isolation trenches in the substrate elongated in the first direction between active areas of the substrate below the set of strips of charge storage material;
    forming a pattern over the set of strips of charge storage material for etching a set of charge storage structures from each set;
    covering a portion of the pattern with a cover;
    etching at least one of said one or more additional layers while covering the portion of the pattern;
    removing the cover from the portion of the pattern;
    etching the set of strips of charge storage material using the pattern to form the sets of charge storage structures, wherein the charge storage structures of a set include sidewalls elongated in the first direction with spaces between sidewalls of structures adjacent in the second direction;
    forming a second layer of dielectric material along the sidewalls of the set of charge storage structures; and
    forming a set of strips of conductive material elongated in the second direction and at least partially occupying the spaces between adjacent charge storage structures.

2. The method of claim 1, further comprising:
    etching the set of strips of charge storage material after removing the cover to form a gate region for a select gate of each set, the gate region having a dimension in the first direction substantially equal to a dimension of the cover in the first direction.

3. The method of claim 2, wherein:
    the one or more additional layers include a first layer having a material composition substantially similar to a material composition of the pattern;
    the first layer protects at least one different layer of the one or more additional layers during at least a portion of etching the set of strips of charge storage material.

4. The method of claim 2, wherein the substrate includes a memory array region and a peripheral circuitry region, the pattern is formed at the memory array region of the substrate, the method further comprising:
    applying a strip of resist material over the one or more additional layers at a portion of the peripheral circuitry region of the substrate;
    wherein etching the at least one of the one or more additional layers is performed while said strip of resist material is over the portion of the peripheral circuitry region of the substrate.

5. The method of claim 4, further comprising:
    removing the strip of resist material;
    etching the set of strips of charge storage material after removing the strip of resist material to form a gate region for at least one peripheral circuitry transistor associated with the sets of charge storage structures, the gate region having a dimension in the first direction substantially equal to a dimension of the strip of photoresist in the first direction.

6. The method of claim 1, wherein:
    the sets of charge storage structures are sets of conductive floating gate regions.

7. The method of claim 6, wherein the sets of conductive floating gate regions are NAND strings of flash memory cells.

8. The method of claim 1, wherein:
    the strips of charge storage material include a first layer of polysilicon and a second layer of polysilicon;
    etching the set of strips of charge storage material includes etching the second layer of polysilicon to form a second charge storage region for each charge storage structure and etching the first layer of polysilicon to form a first charge storage region for each charge storage structure;
    wherein prior to etching the first layer of polysilicon, the method includes forming a set of spacers along the sidewalls of the second charge storage regions;

wherein etching the first layer of polysilicon includes using the set of spacers as a pattern such that a dimension of the second charge storage regions in the first direction is less than a dimension of the first charge storage regions in the first direction.

9. The method of claim 8, wherein:

the first layer of polysilicon is doped polysilicon;

the second layer of polysilicon is undoped polysilicon; and the strips of conductive material are undoped polysilicon.

10. The method of claim 1, wherein the strips of conductive material are continuous in the second direction across the sets of charge storage structures thereby intrinsically forming word lines for the sets of charge storage structures.

11. The method of claim 1, wherein the one or more additional layers are formed prior to forming the isolation trenches.

12. The method of claim 1, wherein the one or more additional layers include a first layer formed prior to forming the isolation trenches and a second layer formed after forming the isolation trenches.

* * * * *